United States Patent
Lee et al.

(10) Patent No.: US 11,240,927 B2
(45) Date of Patent: Feb. 1, 2022

(54) COVER WINDOW AND DISPLAY MODULE INCLUDING THE SAME

(71) Applicant: Samsung Display Co., Ltd., Yongin-si (KR)

(72) Inventors: Sang Keun Lee, Seoul (KR); Jae Hong Kim, Hwaseong-si (KR); Jong Seok Joo, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 154 days.

(21) Appl. No.: 16/797,197

(22) Filed: Feb. 21, 2020

(65) Prior Publication Data

US 2020/0305298 A1    Sep. 24, 2020

(30) Foreign Application Priority Data

Mar. 22, 2019    (KR) .................... 10-2019-0032880

(51) Int. Cl.
| | |
|---|---|
| *H05K 5/03* | (2006.01) |
| *H05K 9/00* | (2006.01) |
| *H05K 5/00* | (2006.01) |
| *G02B 6/00* | (2006.01) |

(52) U.S. Cl.
CPC ............. *H05K 5/03* (2013.01); *G02B 6/00* (2013.01); *H05K 5/0017* (2013.01); *H05K 9/002* (2013.01); *H05K 9/0054* (2013.01)

(58) Field of Classification Search
CPC ........ H05K 5/03; H05K 5/0017; H05K 9/002; H05K 9/0054; G02B 6/00
See application file for complete search history.

(56) References Cited

U.S. PATENT DOCUMENTS

| | | | |
|---|---|---|---|
| 2009/0245565 A1* | 10/2009 | Mittleman | H04R 1/025 381/365 |
| 2012/0045081 A1* | 2/2012 | Mittleman | H04R 1/02 381/334 |
| 2018/0164613 A1 | 6/2018 | Ye et al. | |
| 2018/0164619 A1* | 6/2018 | Kim | G06F 1/16 |
| 2020/0093016 A1* | 3/2020 | Yee | H05K 5/03 |
| 2020/0290325 A1* | 9/2020 | Cheon | B32B 27/308 |

FOREIGN PATENT DOCUMENTS

| | | |
|---|---|---|
| KR | 10-2014-0092138 | 7/2014 |
| KR | 20140092138 A * | 7/2014 |

* cited by examiner

*Primary Examiner* — Mary Ellen Bowman
(74) *Attorney, Agent, or Firm* — H.C. Park & Associates, PLC

(57) ABSTRACT

A cover window includes a window member and a protective member. The window member includes a light transmitting area and a light shielding area. The protective member is disposed on a surface of the window member and includes an incision pattern. The light shielding area includes a trench portion extending concavely toward the light transmitting area. The protective member overlaps the trench portion in a thickness direction.

20 Claims, 27 Drawing Sheets

COVER WINDOW AND DISPLAY MODULE INCLUDING THE SAME

CROSS-REFERENCE TO RELATED APPLICATION

This application claims priority to and the benefit of Korean Patent Application No. 10-2019-0032880, filed Mar. 22, 2019, which is hereby incorporated by reference for all purposes as if fully set forth herein.

BACKGROUND

Field

Exemplary embodiments generally relate to a cover window and a display module including the same.

Discussion

Various mobile electronic apparatuses, such as mobile phones, navigation systems, digital cameras, electronic books, portable game machines, various terminals, etc., may utilize a display device, such as a liquid crystal display (LCD) or an electroluminescent display (e.g., organic light emitting diode (OLED) display). In a conventional display device used in such a mobile apparatus, a cover window may be provided in front of a display panel and may be transparent so that a user can see a display portion of the display panel. The display panel may be divided into a display area in which an actual image is displayed and a non-display area outside (e.g., surrounding) the display area. The cover window may be divided into a light transmitting area corresponding to the display area and a light shielding area (e.g., an opaque light shielding area) corresponding to the non-display area. It is also noted that the mobile apparatus may include various components, such as at least one of a speaker, a camera, a proximity sensor, a physical button, an electrostatic button, and a microphone, in addition to the display device. These components may be located on or behind the light shielding area of the cover window. As such, various holes may be formed in the cover window to allow the components to perform their functions.

The above information disclosed in this section is only for understanding the background of the inventive concepts, and, therefore, may contain information that does not form prior art.

SUMMARY

Some exemplary embodiments provide a cover window capable of preventing or at least reducing (hereinafter, referred to as "preventing") damage and contamination of holes formed in a cover window in (or during) a manufacturing process.

Some exemplary embodiments provide a display module including a cover window capable of preventing damage and contamination of holes formed in a cover window in a manufacturing process.

Additional aspects will be set forth in the detailed description which follows, and, in part, will be apparent from the disclosure, or may be learned by practice of the inventive concepts.

According to some exemplary embodiments, a cover window includes a window member and a protective member. The window member includes a light transmitting area and a light shielding area. The protective member is disposed on a surface of the window member and includes an incision pattern. The light shielding area includes a trench portion extending concavely toward the light transmitting area. The protective member overlaps the trench portion in a thickness direction.

According to some exemplary embodiments, a cover window includes a window member and a protective member. The window member includes a light transmitting area and a light shielding area. The protective member is disposed on a surface of the window member and includes a plurality of air holes. The light shielding area includes a trench portion extending concavely toward the light transmitting area. The protective member overlaps the trench portion in a thickness direction.

According to some exemplary embodiments, a display module includes a cover window and a display panel disposed on the cover window. The cover window includes a window member and a protective member. The window member includes a light transmitting area and a light shielding area. The protective member disposed on a surface of the window member. The protective member includes an incision pattern. The light shielding area includes a trench portion extending concavely toward the light transmitting area. The protective member overlaps the trench portion in a thickness direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
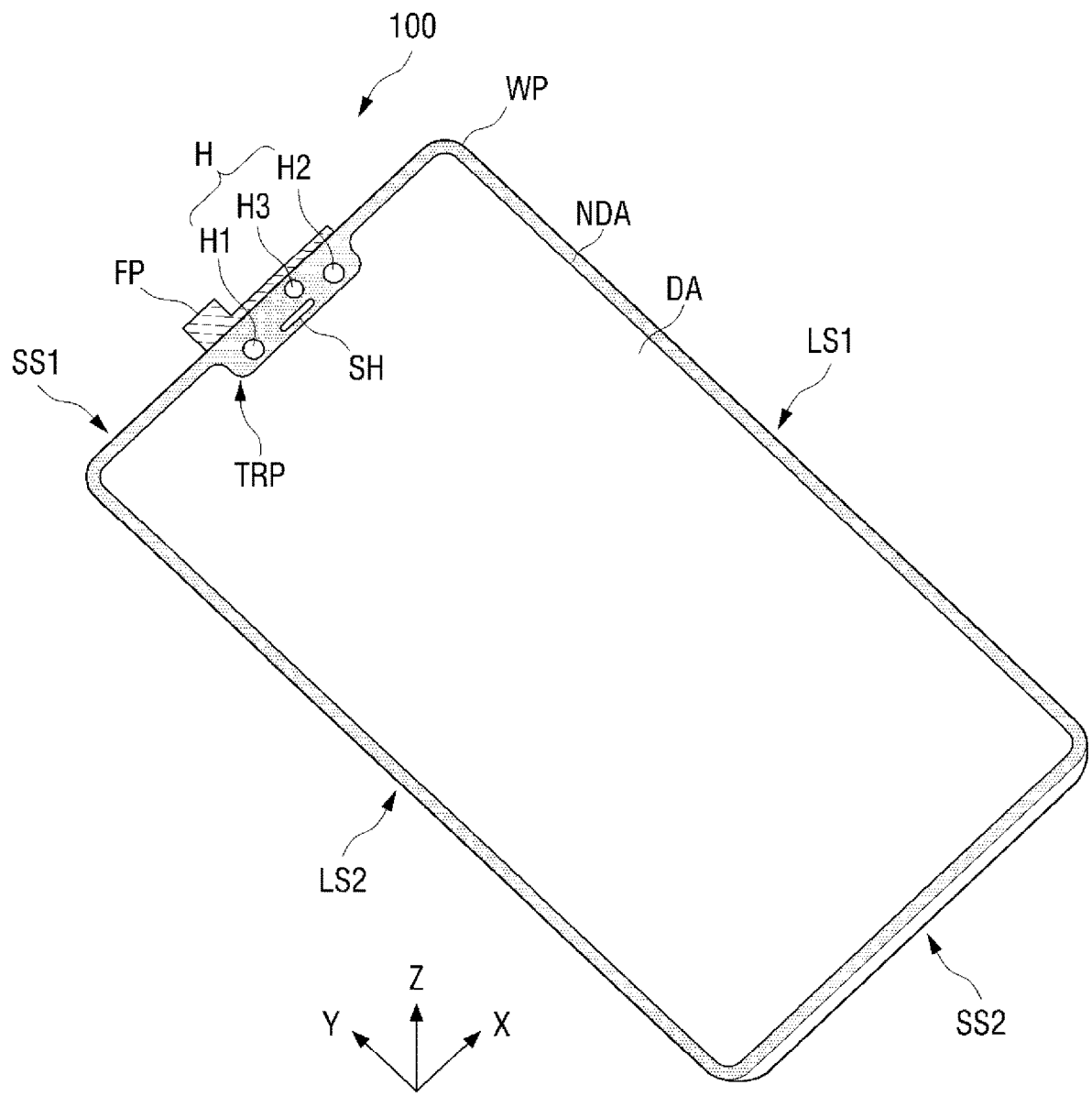
FIG. 1 is a perspective view of a cover window according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 27:
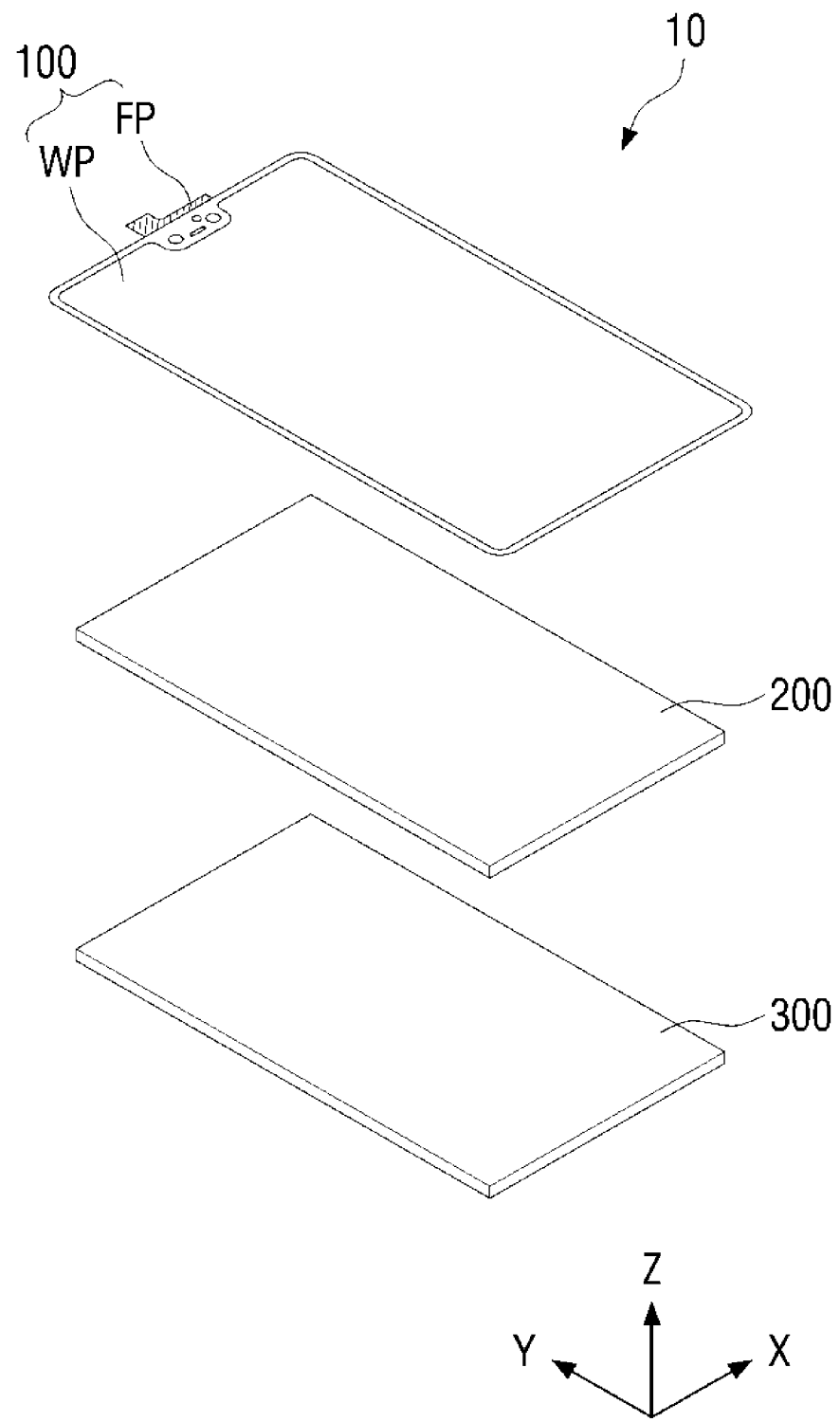
FIG. 27 is an exploded perspective view of a display module including a cover window according to some exemplary embodiments.

FIG. 1 is a perspective view of a cover window according to some exemplary embodiments. FIG. 27 is an exploded perspective view of a display module including a cover window according to some exemplary embodiments.

Referring to FIG. 1, a cover window 100 according to some exemplary embodiments may be formed in a rectangular shape in plan view. For example, the cover window 100 may have a rectangular shape having corner (e.g., rounded corners, perpendicular corners, etc.) in plan view. The cover window 100 may include first and second long sides LS1 and LS2 and first and second short sides SS1 and SS2. In the cover window 100 having a rectangular shape, in plan view, a long side located on the right side is referred to as a first long side LS1, a long side located on the left side is referred to as a second long side LS2, a short side located on the upper side is referred to as a first short side SS1, and a short side located on the lower side is referred to as a second short side SS2. The length of the first and second long sides LS1 and LS2 of the cover window 100 may be in a range of 1.5 to 2.5 times the length of the first and second short sides SS1 and SS2, but exemplary embodiments are not limited thereto. Further, the cover window 100 may have a flat rectangular shape, but exemplary embodiments are not limited thereto. For instance, the cover window 100 may be shaped to include a flat portion and a curved surface having a constant (or variable) curvature from the flat portion, or include a curved surface only.

In some exemplary embodiments, the cover window 100 may include a window member WP and a protective member FP.

As shown in FIGS. 1 and 27, the window member WP may include a light transmitting area DA corresponding to a display area of a display panel 300, and a light shielding area NDA corresponding to a non-display area of the display panel 300 and/or an area other than corresponding to the display panel 300. The light shielding area NDA may be disposed to surround the light transmitting area DA and may include a trench portion TRP. For example, the trench portion TRP, which is recessed in a trench shape toward the inside of the light transmitting area DA, may be disposed at the first short side SS1 of the window member WP, but exemplary embodiments are not limited thereto. For instance, the trench portion TRP may be disposed on at least one of the first short side SS1, the second short side SS2, the first long side LS1, and the second long side LS2 of the window member WP.

The light shielding area NDA may be formed opaquely. In some exemplary embodiments, the light shielding area NDA may be formed as a decorative layer having a pattern that can be displayed (or presented) to the user when an image is not displayed. For example, a company's logo, such as "SAMSUNG," or various characters may be presented (e.g., patterned, printed, etc.) in the light shielding area NDA.

The light shielding area NDA may include a plurality of holes H for exposing, for instance, a front camera, an infrared sensor, an iris recognition sensor, an ultrasonic sensor, an illuminance sensor, and/or the like, but exemplary embodiments are not limited thereto. For example, some or all of the front camera, the infrared sensor, the iris recognition sensor, the ultrasonic sensor, and the illuminance sensor may be incorporated in (or as part of) the display panel 300 illustrated in FIG. 27. As such, some or all of the holes H of the light shielding area NDA may be omitted. In addition, a speaker hole SH for exposing a front speaker may be disposed in the light shielding area NDA. In some exemplary embodiments, the plurality of holes H and the speaker hole SH may be disposed in the trench portion TRP of the light shielding area NDA. However, without being limited thereto, the holes H may be distributed and disposed in the light shielding area NDA disposed on the first short sides SS1, the second short side SS2, the first long side LS1, and/or the second long side LS2.

The window member WP may be made of, for instance, glass, sapphire, and/or plastic. The window member WP may be rigid and/or flexible.

The protective member FP may be disposed on the back surface of the window member WP. For example, the protective member FP may be disposed on the lower surface of the trench portion TRP of the light shielding area NDA. Hereinafter, unless otherwise specified, one surface of the cover window 100 on which the protective member FP is disposed is referred to as the lower surface of the cover window 100.

Figure 2:
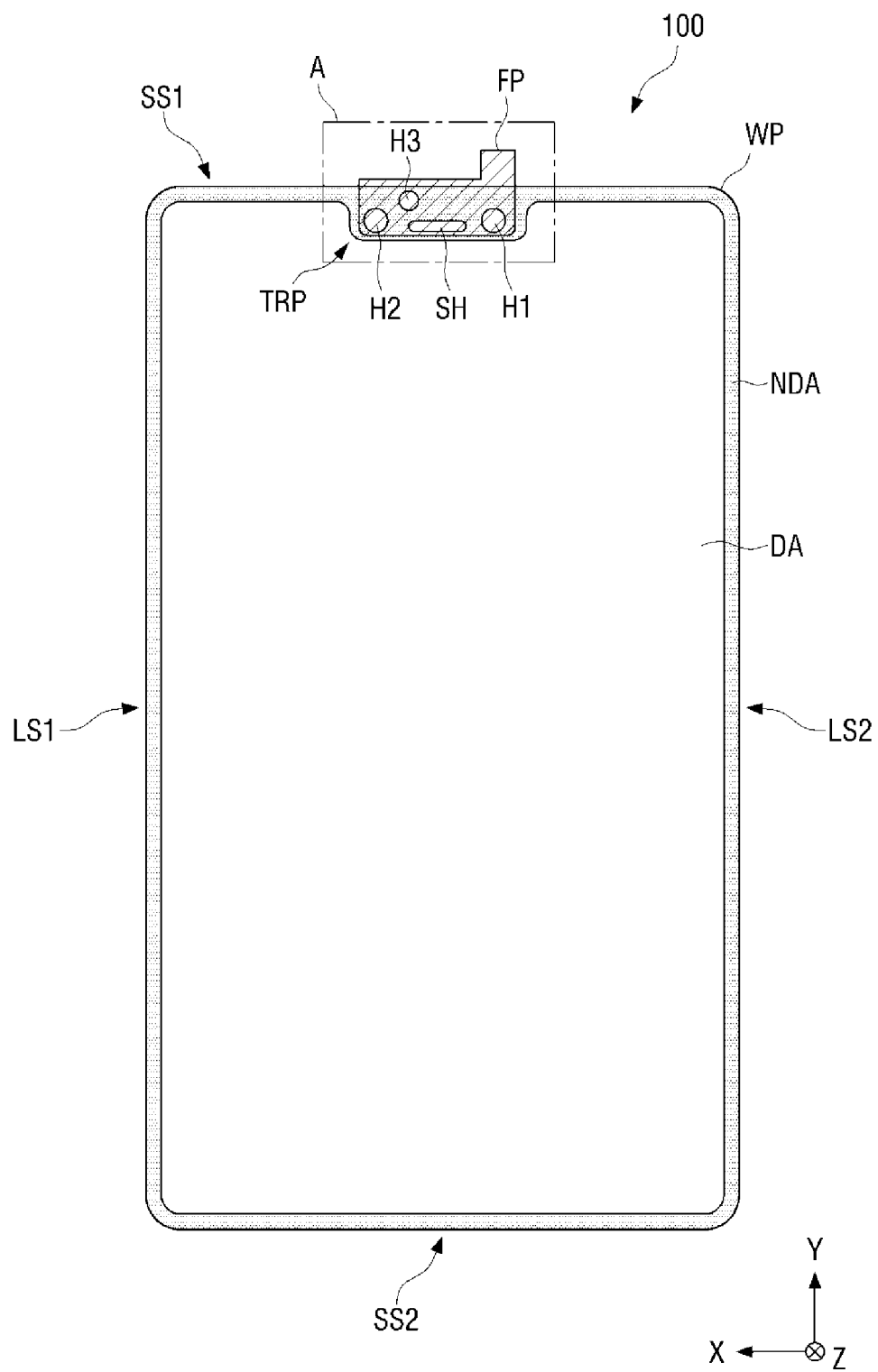
FIG. 2 schematically shows a bottom view of a cover window according to some exemplary embodiments.
Figure 3:
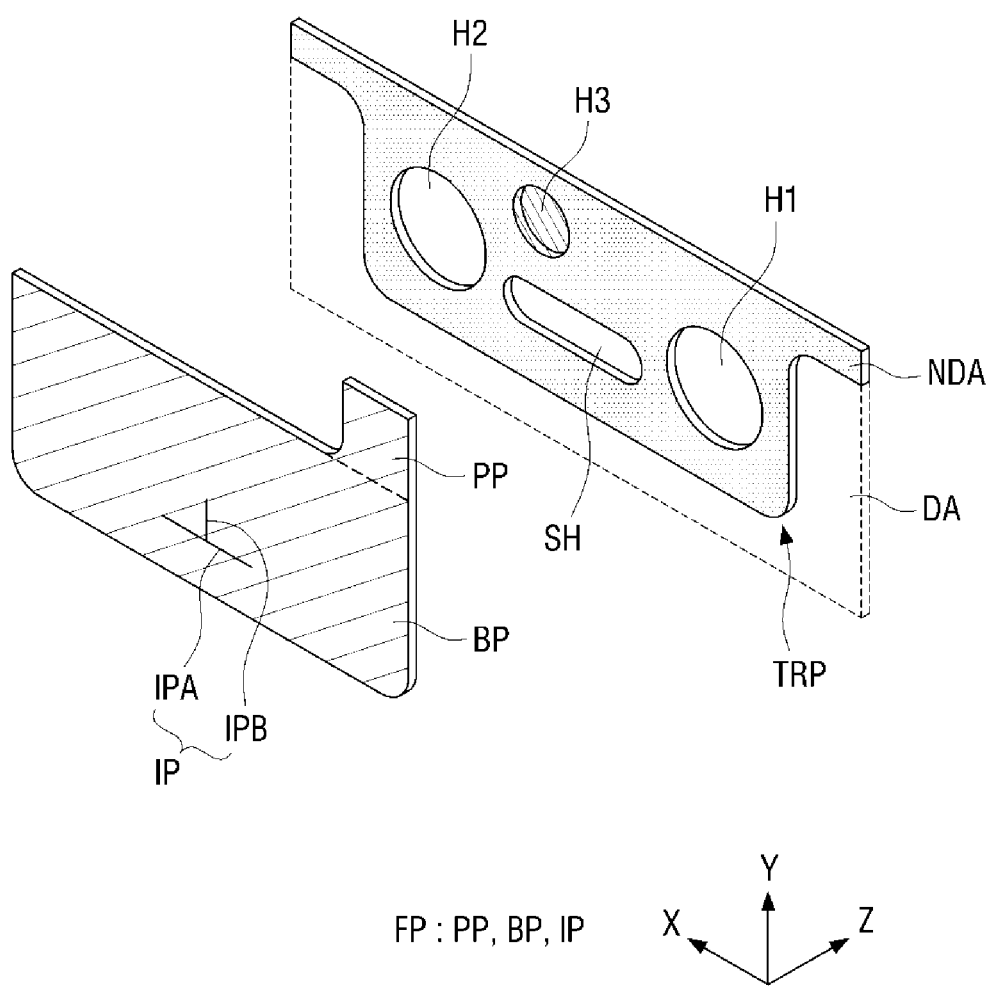
FIG. 3 is an exploded perspective view of a trench portion of a cover window according to some exemplary embodiments.

FIG. 2 schematically shows a bottom view of a cover window according to some exemplary embodiments. FIG. 3 is an exploded perspective view of a trench portion of a cover window according to some exemplary embodiments.

The window member WP and the protective member FP included in the cover window 100 will be described in more detail with reference to FIGS. 2 and 3. The window member WP may include first to third holes H1, H2, and H3 and the speaker hole SH.

Figure 8:
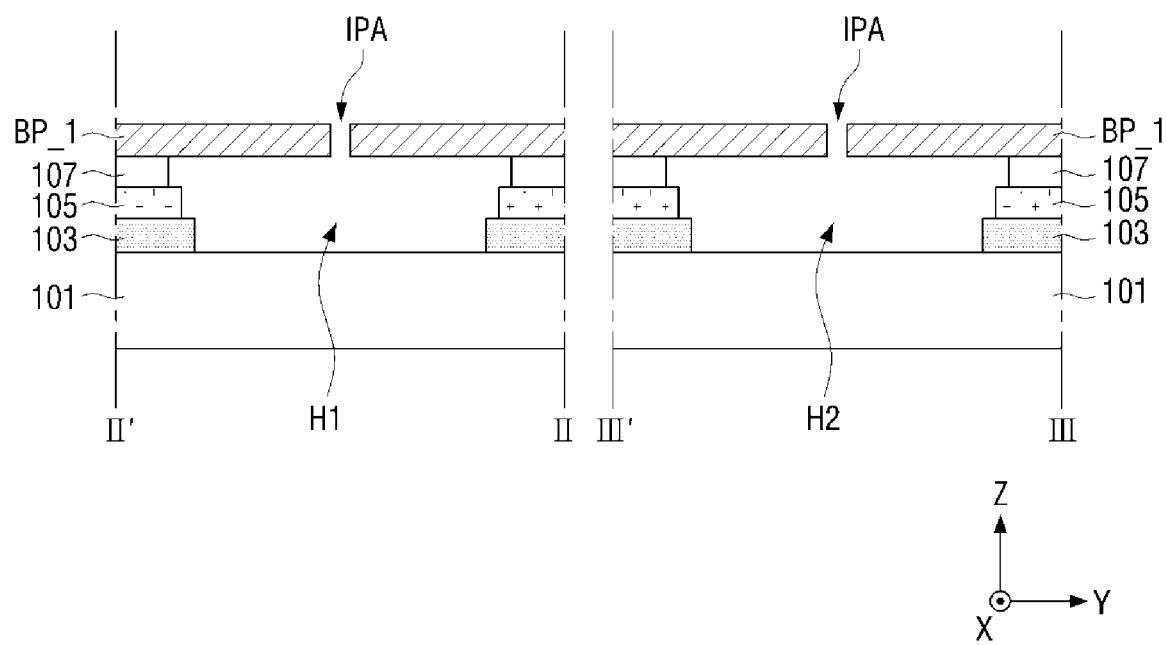
FIG. 8 is a cross-sectional view taken along sectional lines II-II' and of FIG. 7 according to some exemplary embodiments.
Figure 11:
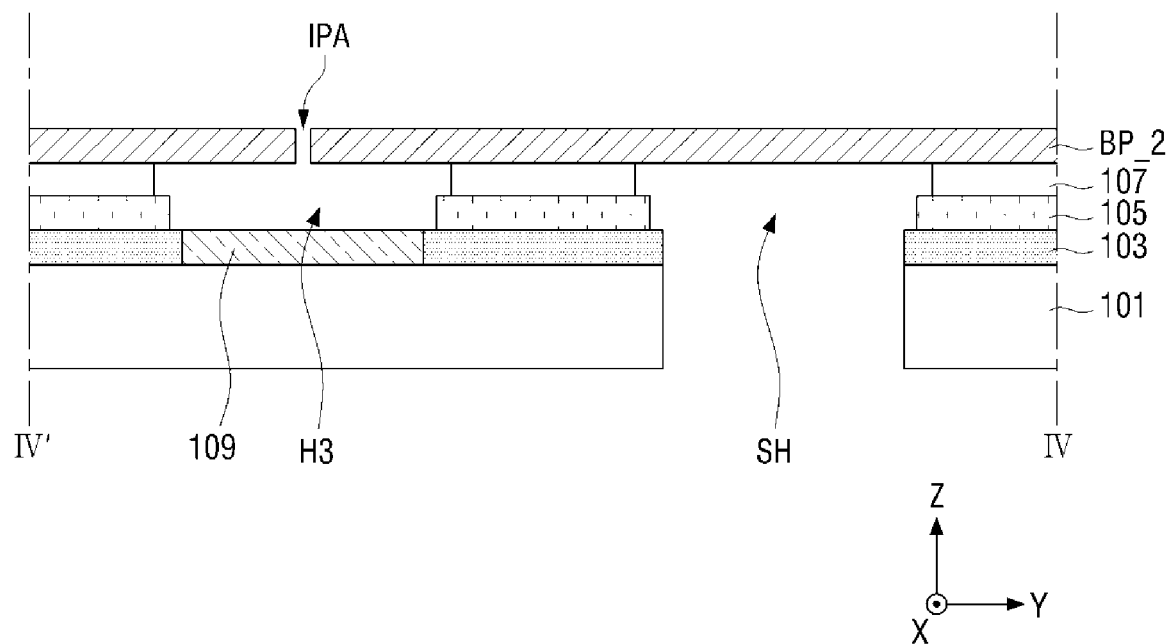
FIG. 11 is a cross-sectional view taken along sectional line IV-IV' of FIG. 10 according to some exemplary embodiments.

The first to third holes H1, H2, and H3 may be disposed in a region corresponding to the iris recognition sensor, the ultrasonic sensor, the illuminance sensor, the infrared sensor, the camera, and/or the like. However, exemplary embodiments are not limited thereto, and the number and arrangement of holes H may be variously modified depending on the apparatus and function to which the window member 100 is applied. The first to third holes H1, H2, and H3 may be optical holes defined by printing layers 103, 105, 107, and 109 disposed on a transparent base layer 101, such as shown in FIGS. 8 and 11 that will be described later in more detail.

Figure 5:
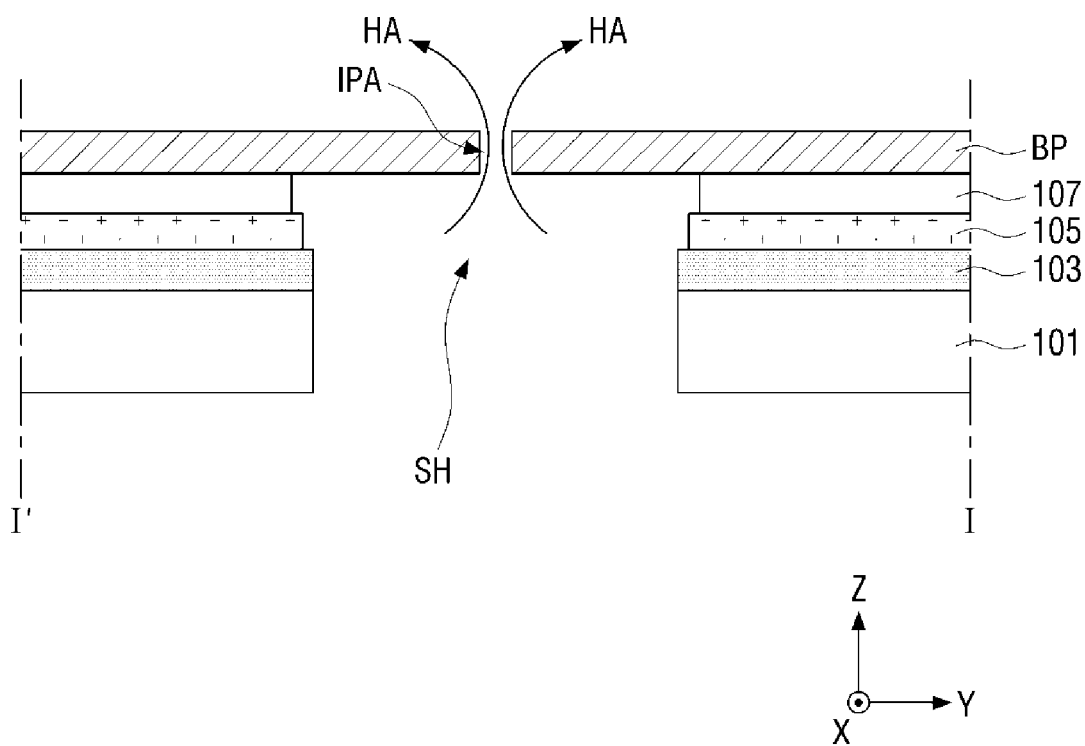
FIG. 5 is a cross-sectional view taken along sectional line I-I' of FIG. 4 according to some exemplary embodiments.

The speaker hole SH emits sound produced by the speaker to the outside of a display module 10. Unlike the first to third holes H1, H2, and H3, the speaker hole SH may be formed to pass through the transparent base layer 101 (i.e., as a physical hole, e.g., a physical through hole) as shown in FIG. 5. In some exemplary embodiments, the window member WP may not include the speaker hole SH.

The protective member FP may include a body portion BP, a protrusion portion PP extending in a second direction (e.g., Y-axis direction) from the body portion BP, and an incision pattern IP formed in the body portion BP. As described above, the protective member FP is disposed on the lower surface of the window member WP.

The protective member FP may be formed of a film including, for instance, a polyethylene terephthalate (PET)-based resin. However, exemplary embodiments are not limited thereto. For instance, the protective member FP may be formed to include at least one of a polyester (PE)-based resin, a polystyrene (PS)-based resin, an acrylic resin, a polycarbonate (PC)-based resin, a cycloolefin polymer (COP), and the like.

The body portion BP may overlap the trench portion TRP in a third direction (e.g., Z-axis direction), which is a thickness direction. Further, the area of the body portion BP may be smaller than the area of the trench portion TRP, but may be an area that covers the first hole H1, the second hole H2, the third hole H3, as well as covers the speaker hole SH. However, exemplary embodiments are not limited thereto. In some exemplary embodiments, the area of the body portion BP may be equal to or greater than the area of the trench portion TRP. Further, one surface of the body portion BP in contact with the trench portion TRP may include an adhesive material.

The protrusion portion PP may be shaped such that a part of an upper end of the body portion BP extends in the second direction (e.g., Y-axis direction). For example, the width of the protrusion portion PP in a first direction (e.g., X-axis direction) may be smaller than the width of the body portion BP in the first direction (e.g., X-axis direction). However, exemplary embodiments are not limited thereto. For instance, the width of the protrusion portion PP in the first direction (e.g., X-axis direction) may be equal to the width of the body portion BP in the first direction (e.g., X-axis direction), and the width of the protrusion portion PP in the first direction (e.g., X-axis direction) may be greater than the width of the body portion BP in the first direction (e.g., X-axis direction).

The protrusion portion PP may not overlap the trench portion TRP in the third direction (e.g., Z-axis direction). For example, the protrusion portion PP may be shaped to protrude to one side of the window member WP. However, exemplary embodiments are not limited thereto. In some exemplary embodiments, the protrusion portion PP may partially overlap with the trench portion TRP in the third direction (e.g., Z-axis direction). Unlike the body portion BP, one surface of the protrusion portion PP may not include an adhesive material. As described above, the protrusion portion PP of the protective member FP is shaped to protrude to one side of the window member WP that advantageously makes it easy to attach and detach the protective member FP.

The incision pattern IP may include a first incision portion IPA and a second incision portion IPB. For example, the first incision portion IPA may extend in the first direction (e.g., X-axis direction), and the second incision portion may extend in the second direction (e.g., Y-axis direction) from the center of the first incision portion IPA. The first incision portion IPA and the second incision portion IPB may be formed by cutting the protective member FP, but exemplary embodiments are not limited thereto. The incision pattern IP may be disposed as an air flow passage in the body portion BP of the protective member FP.

Figure 15:
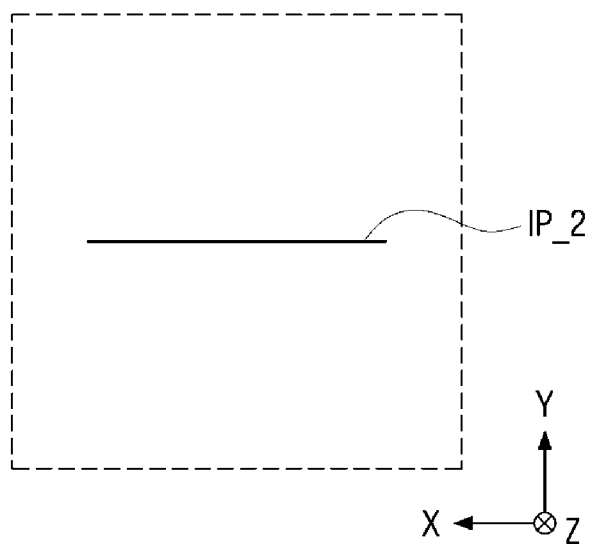
FIG. 15 is a diagram schematically showing a shape of an incision pattern according to some exemplary embodiments.
Figure 16:
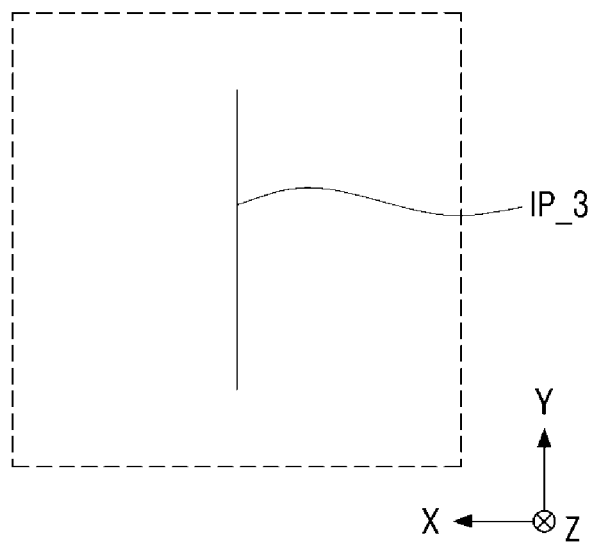
FIG. 16 is a diagram schematically showing a shape of an incision pattern according to some exemplary embodiments.
Figure 17:
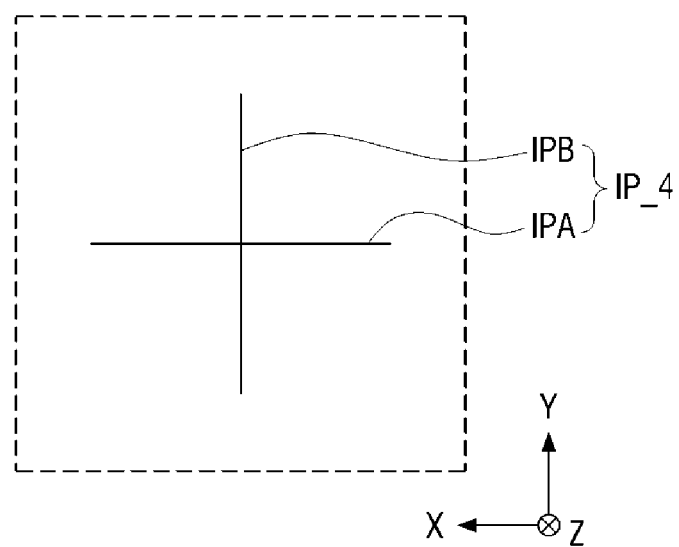
FIG. 17 is a diagram schematically showing a shape of an incision pattern according to some exemplary embodiments.
Figure 18:
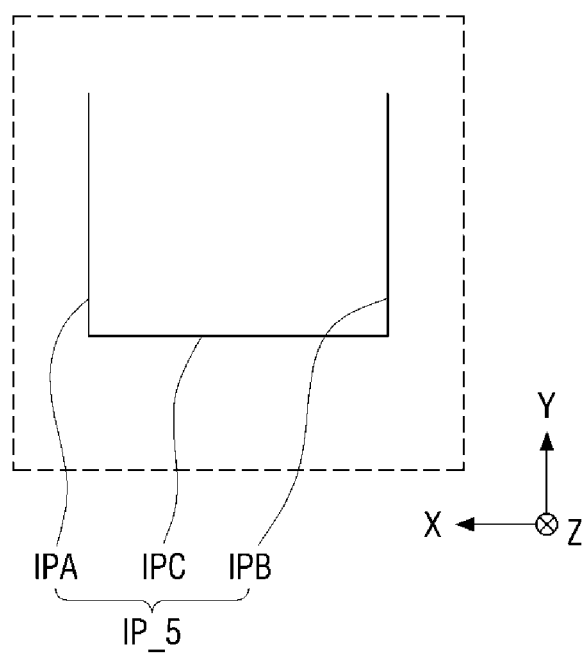
FIG. 18 is a diagram schematically showing a shape of an incision pattern according to some exemplary embodiments.
Figure 19:
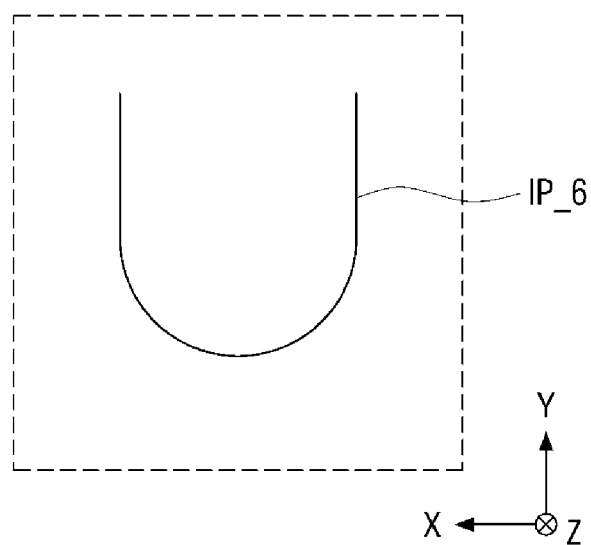
FIG. 19 is a diagram schematically showing a shape of an incision pattern according to some exemplary embodiments.
Figure 20:
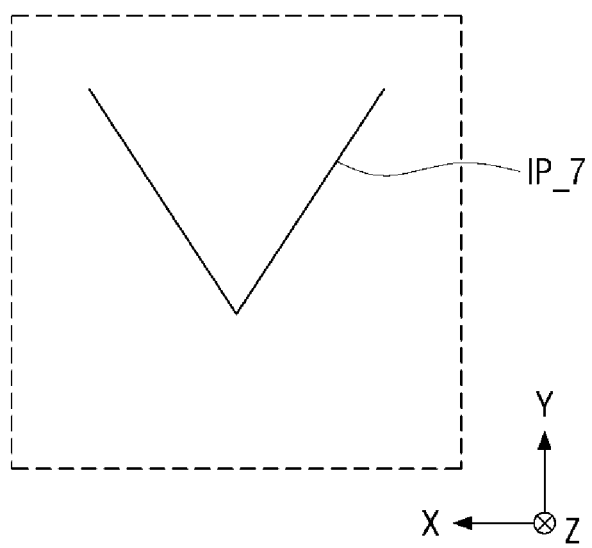
FIG. 20 is a diagram schematically showing a shape of an incision pattern according to some exemplary embodiments.
Figure 21:
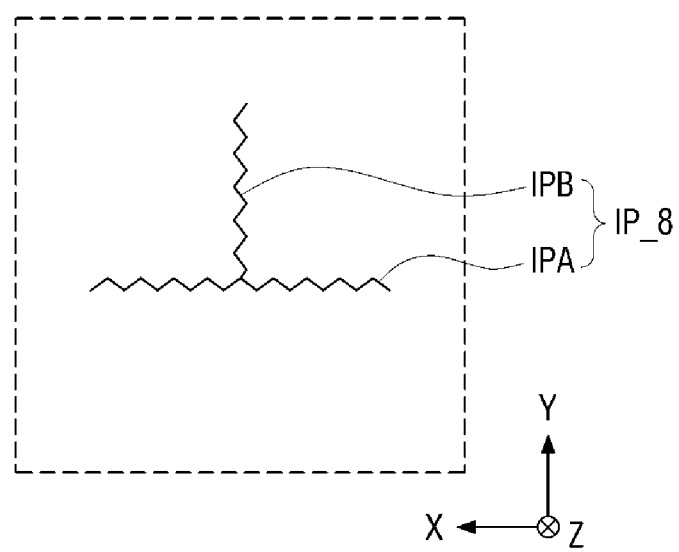
FIG. 21 is a diagram schematically showing a shape of an incision pattern according to some exemplary embodiments.

The shape of the incision pattern IP shown in FIG. 3 is exemplary, and is not limited thereto. For instance, FIGS. 15 to 21 are diagrams schematically showing shapes of incision patterns according to various exemplary embodiments. Referring to FIG. 15, an incision pattern IP_2 may include one incision portion extending in the first direction (e.g., X-axis direction). Referring to FIG. 16, an incision pattern IP_3 may include one incision portion extending in the second direction (e.g., Y-axis direction). Further, the incision portion may be formed to extend in a direction between the first direction (e.g., X-axis direction) and the second direction (e.g., Y-axis direction). Further, as shown in FIG. 17, an incision pattern IP_4 may include a first incision portion IPA extending in the first direction (e.g., X-axis direction) and a second incision portion IPB extending in the second direction (e.g., Y-axis direction) and crossing the first incision portion IPA. As shown in FIG. 18, an incision pattern IP_5 may include a first incision portion IPA and a second incision portion IPB that extend in the second direction (e.g., Y-axis direction) and are separated from each other, and a third incision portion IPC connecting the first incision portion IPA and the second incision portion IPB in the first direction (e.g., X-axis direction). As shown in FIG. 19, an incision pattern IP_6 may include an incision portion having a U-shape. As shown in FIG. 20, an incision pattern IP_7 may include an incision portion having a V-shape. As shown in FIG. 21, an incision pattern IP_8 may include a first incision portion IPA extending in the first direction (e.g., X-axis direction) and having a zigzag shape, and a second incision portion IPB extending from the first incision portion IPA in the second direction (e.g., Y-axis direction) and having a zigzag shape. Although not shown, the incision portion included in each of the incision patterns IP_2, IP_3, IP_4, IP_5, IP_6, and IP_7 in FIGS. 15 to 20 may also be formed in a zigzag shape. The incision pattern IP may have various other shapes.

Figure 4:
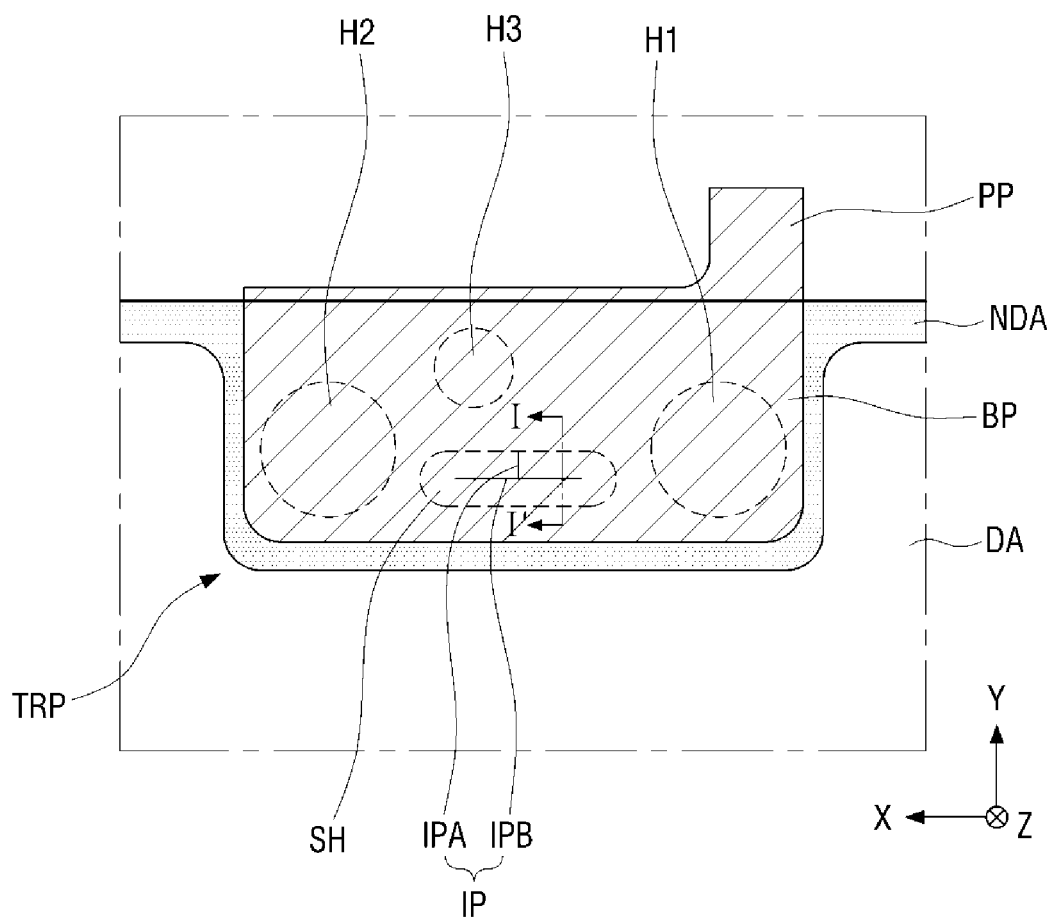
FIG. 4 is an enlarged view of portion A of FIG. 2 according to some exemplary embodiments.

FIG. 4 is an enlarged view of portion A of FIG. 2 according to some exemplary embodiments. FIG. 5 is a cross-sectional view taken along sectional line I-I' of FIG. 4 according to some exemplary embodiments.

Referring to FIG. 4, the protective member FP may be attached to the lower surface of the window member WP. For example, the protective member FP may be attached to the trench portion TRP of the lower surface of the window member WP through the adhesive material included in (or on) one surface of the body portion BP of the protective member FP. As described above, the protrusion portion PP may be disposed to protrude to the upper end of the window member WP, and the protrusion portion PP of the protective member FP may not overlap the window member WP.

The body portion BP may cover the first hole H1, the second hole H2, the third hole H3, and the speaker hole SH, thereby preventing contamination and damage of the first hole H1, the second hole H2, the third hole H3, and the speaker hole SH during a manufacturing process. In addition, as shown in FIG. 4, a part of the upper end of the body portion BP may not overlap the window member WP in the third direction (e.g., Z-axis direction). However, exemplary embodiments are not limited thereto, and the entire body portion BP may overlap the window member WP in the third direction (e.g., Z-axis direction). Further, although it is illustrated in FIG. 4 that the area of the body portion BP of the protective member FP is smaller than the area of the trench portion TRP, exemplary embodiments are not limited thereto. The area of the body portion BP of the protective member FP may have the same area as that of the trench portion TRP or may have an area larger than that of the trench portion TRP. The body portion BP and the protrusion portion PP may have rectangular shapes of different sizes. However, without being limited thereto, the body portion BP and the protrusion portion PP may have various shapes, such as a triangular shape, a circular shape, etc.

Although it is illustrated in FIG. 4 that one protective member covers the first hole H1, the second hole H2, the third hole H3, and the speaker hole SH, exemplary embodiments are not limited thereto. In some exemplary embodiments, a plurality of protective members FP may be disposed to individually cover the first hole H1, the second hole H2, the third hole H3, and the speaker hole SH, respectively. In this case, each of the plurality of protective members FP may include the body portion BP and the protrusion portion PP.

In some exemplary embodiments, the incision pattern IP may be located corresponding to the speaker hole SH. For example, each of the first incision portion IPA and the second incision portion IPB of the incision pattern IP may overlap the speaker hole SH in the third direction (e.g., Z-axis direction). However, exemplary embodiments are not limited thereto. In some exemplary embodiments, a part of the first incision portion IPA and/or the second incision portion IPB may extend outside the speaker hole SH and may not overlap the speaker hole SH in the third direction (e.g., Z-axis direction).

The length of the first incision portion IPA in the first direction (e.g., X-axis direction) may be longer than the length of the second incision portion IPB in the second direction (e.g., Y-axis direction). However, exemplary embodiments are not limited thereto. In some exemplary embodiments, the length of the first incision portion IPA in the first direction (e.g., X-axis direction) may be shorter than the length of the second incision portion IPB in the second direction (e.g., Y-axis direction). In some exemplary embodiments, the length of the first incision portion IPA in the first direction (e.g., X-axis direction) may be equal to the length of the second incision portion IPB in the second direction (e.g., Y-axis direction).

Each of the first incision portion IPA and the second incision portion IPB is formed so as to pass through the protective member FP such that an air flow passage is formed in the protective member FP.

Referring to FIGS. 4 and 5, the light shielding area NDA of the window member WP may include the transparent base layer 101 and the first to third printing layers 103, 105, and 107 disposed on one surface of the transparent base layer 101. A printing layer functions to cover electrode wiring and the like of the display panel 300 and is generally a decorative layer, such as a black matrix.

The transparent base layer 101 may be made of, for instance, glass, sapphire, plastic, and/or the like, but is not limited thereto.

The first to third printing layers 103, 105, and 107 may be implemented as a plurality of stacked printing layers. For example, the first to third printing layers 103, 105, and 107 may include a first printing layer 103, a second printing layer 105 and a third printing layer 107 that are sequentially disposed on one surface of the transparent base layer 101. The first printing layer 103, the second printing layer 105, and the third printing layer 107 may have different colors. For example, the first printing layer 103 may have a black-based color, the second printing layer 105 may have a gray-based color, and the third printing layer 107 may be transparent, but exemplary embodiments are not limited thereto. The first to third printing layers 103, 105, and 107 may be implemented in colors, such as white, pearl, silver, gold, and pink to enhance the aesthetic appeal or print, for instance, the logo. Further, the first printing layer 103, the second printing layer 105, and the third printing layer 107 may have the same thickness, but exemplary embodiments are not limited thereto. In some exemplary embodiments, the first printing layer 103, the second printing layer 105, and the third printing layer 107 may have different thicknesses. In some exemplary embodiments, two of the first printing layer 103, the second printing layer 105, and the third printing layer 107 may have the same thickness and the other one may have a different thickness.

The first printing layer 103, the second printing layer 105, and the third printing layer 107 may have a step or curvature. For instance, the first printing layer 103, the second printing layer 105, and the third printing layer 107 may be stacked to have different widths. For example, the first printing layer 103, the second printing layer 105, and the third printing layer 107 may have sequentially decreasing widths. However, exemplary embodiments are not limited thereto. For instance, the first printing layer 103, the second printing layer 105, and the third printing layer 107 may be stacked to have the same width.

As shown in FIG. 5, the speaker hole SH disposed in the trench portion TRP of the window member WP may be defined by the transparent base layer 101, the first printing layer 103, the second printing layer 105, and the third printing layer 107. For example, a region corresponding to the speaker hole SH disposed in the trench portion TRP may be defined as a physical hole, which is an opening where the transparent base layer 101, the first printing layer 103, the second printing layer 105, and the third printing layer 107 are not disposed.

The body portion BP of the protective member FP is disposed on the third printing layer 107, and the body portion BP may be adhered and fixed to the upper surface of the third printing layer 107 through an insulating material. The incision pattern IP is located above the speaker hole SH. As described above, since the incision pattern IP passes through the protective member FP, an air flow passage corresponding to the incision pattern IP is formed in the protective member FP.

The cover window 100 may be applied to various products. As an example in which the cover window 100 is applied to a display module, the cover window 100 may be bonded on a display panel to constitute a display module. A transparent adhesive, such as an optically clear adhesive (OCA) or an optically clear resin (OCR), may be used to bond the display panel and the cover window 100. For instance, a process of bonding the display panel and the cover window 100 may be performed by an autoclave process for removing air bubbles generated from the optically clear adhesive (OCA) by applying pressure (e.g., constant pressure) and temperature (e.g., constant temperature) after a process of vacuum-bonding the cover window 100 with the optically clear adhesive (OCA) on the display panel. The protective member FP of the cover window 100 may be maintained until assembling a set of the camera and the like after the display module is manufactured. However, in the autoclave process, a conventional protective member may be twisted or lifted due to a hot air flow HA, which may cause contamination and damage to the plurality of holes H1, H2, H3, and SH, and the like of the cover window 100.

According to various exemplary embodiments, the protective member FP includes the incision pattern IP, and the incision pattern IP provides an air flow passage, as shown in FIG. 5. Accordingly, even when exposed to a hot air flow HA in the autoclave process, since the hot air flow HA is discharged through the incision pattern IP, it is possible to effectively prevent twisting or lifting of the protective member FP attached to the window member WP.

Figure 6:
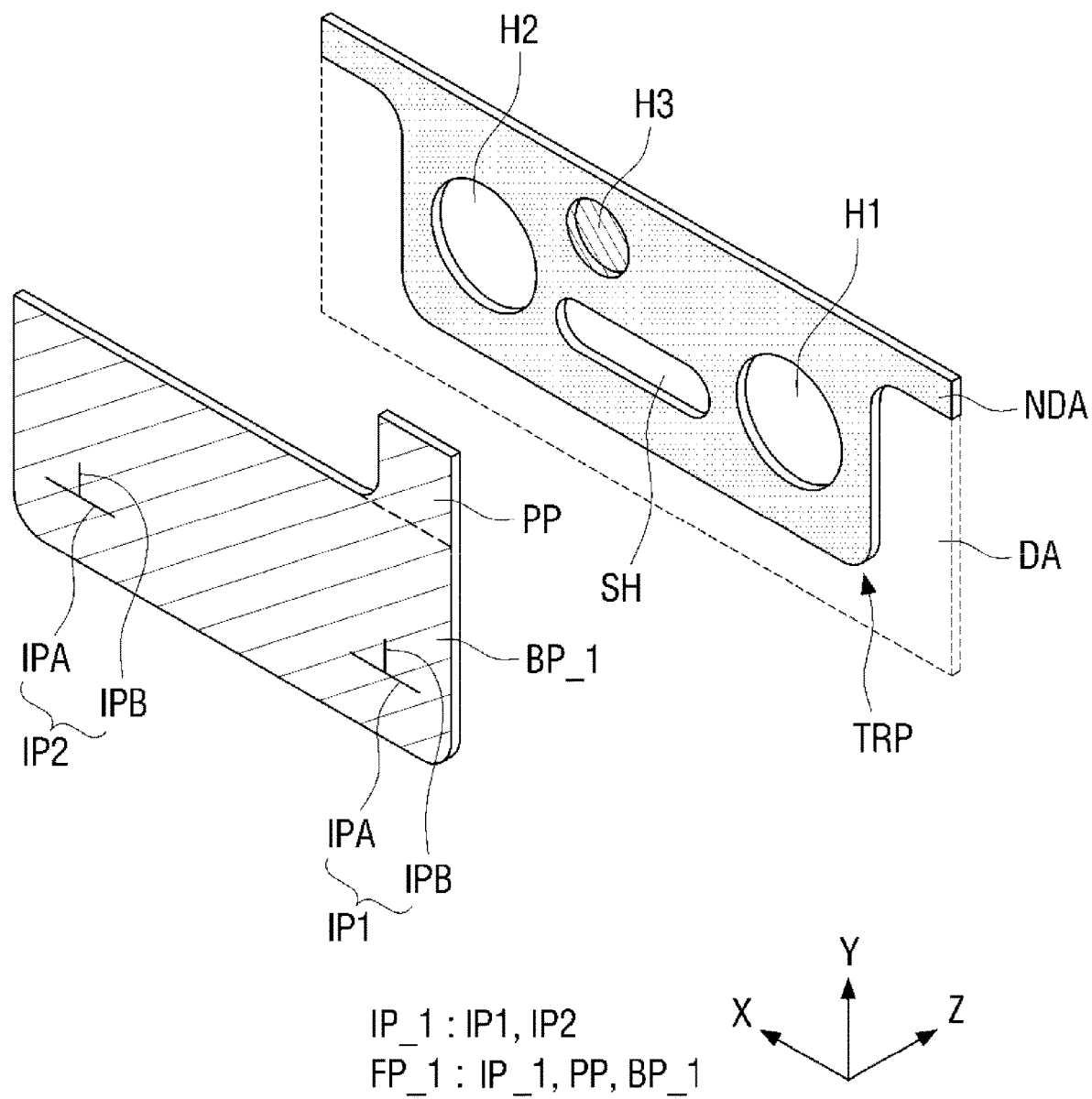
FIG. 6 is an exploded perspective view of a trench portion of a cover window according to some exemplary embodiments.
Figure 7:
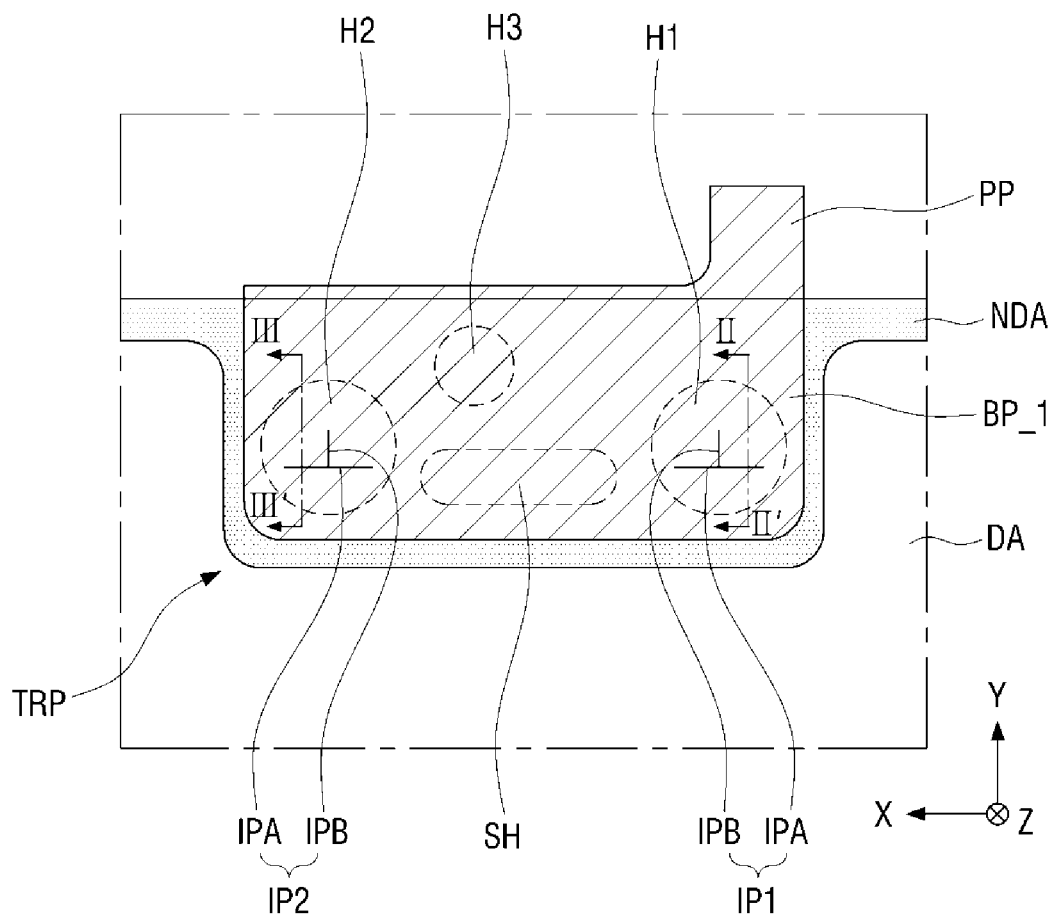
FIG. 7 is an enlarged view of portion A of FIG. 2 according to some exemplary embodiments.

FIG. 6 is an exploded perspective view of a trench portion of a cover window according to some exemplary embodiments. FIG. 7 is an enlarged view of portion A of FIG. 2 according to some exemplary embodiments. FIG. 8 is a cross-sectional view taken along sectional lines II-IP and of FIG. 7 according to some exemplary embodiments. The exemplary embodiments described in association with FIGS. 6 to 8 differ from the exemplary embodiments described in association with FIGS. 3 to 5 in the number and arrangement of incision patterns. As such, a description overlapping with the description with reference to FIGS. 3 to 5 will be omitted, and differences will be mainly described.

Referring to FIGS. 6 and 7, an incision pattern IP_1 may include a first incision pattern IP1 and a second incision pattern IP2. Each of the first incision pattern IP1 and the second incision pattern IP2 may include a first incision portion IPA and a second incision portion IPB. For example, each of the first incision pattern IP1 and the second incision pattern IP2 may include the first incision portion IPA extending in the first direction (e.g., X-axis direction), and the second incision portion IPB extending in the second direction (e.g., Y-axis direction) from the first incision portion IPA.

Each of the first incision pattern IP1 and the second incision pattern IP2 may be disposed in a body portion BP_1 of a protective member FP_1. The first incision pattern IP1 may have the same shape as the second incision pattern IP2, but exemplary embodiments are not limited thereto. For instance, the first incision pattern IP1 and the second incision pattern IP2 may have different shapes.

In some exemplary embodiments, the first incision pattern IP1 and the second incision pattern IP2 may be disposed corresponding to a first hole H1 and a second hole H2. For example, the first incision pattern IP1 may overlap the first hole H1 in the third direction (e.g., Z-axis direction), and the second incision pattern IP2 may overlap the second hole H2 in the third direction (e.g., Z-axis direction). However, exemplary embodiments are not limited thereto. In some exemplary embodiments, the first incision pattern IP1 may not partially overlap the first hole H1 in the third direction (e.g., Z-axis direction), and the second incision pattern IP2 may not partially overlap the second hole H2 in the third direction (e.g., Z-axis direction). Further, in some exemplary embodiments, the first incision pattern IP1 may correspond to the first hole H1, and the second incision pattern IP2 may correspond to the third hole H3. In some exemplary embodiments, the first incision pattern IP1 may correspond to the first hole H1, and the second incision pattern IP2 may correspond to the speaker hole SH.

In some exemplary embodiments, the first incision pattern IP1 and the second incision pattern IP2 may be arranged on the same line in the first direction (e.g., X-axis direction). However, exemplary embodiments are not limited thereto. For instance, the first incision pattern IP1 and the second incision pattern IP2 may not be aligned in the first direction (e.g., X-axis direction).

Each of the first incision pattern IP1 and the second incision pattern IP2 is formed so as to pass through the protective member FP_1 such that an air flow passage is formed in the protective member FP_1.

Referring to FIG. 8, the first hole H1 disposed in the trench portion TRP of the window member WP may be defined by the first printing layer 103, the second printing layer 105, and the third printing layer 107. For example, since the first printing layer 103, the second printing layer 105, and the third printing layer 107 are not disposed in a region corresponding to the first hole H1 disposed in the trench portion TRP, the first hole H1 may be defined by a step with the surrounding light shielding area NDA.

The body portion BP_1 of the protective member FP_1 is disposed on the third printing layer 107, and the body portion BP_1 may be adhered and fixed to the upper surface of the third printing layer 107 through an insulating material. The first incision pattern IP1 is located above the first hole H1 to provide an air flow passage.

The second hole H2 disposed in the trench portion TRP of the window member WP may be defined by the first printing layer 103, the second printing layer 105, and the third printing layer 107. For example, since the first printing layer 103, the second printing layer 105, and the third printing layer 107 are not disposed in a region corresponding to the second hole H2 disposed in the trench portion TRP, the second hole H2 may be defined by a step with the surrounding light shielding area NDA.

The body portion BP_1 of the protective member FP_1 is disposed on the third printing layer 107, and the body portion BP_1 may be adhered and fixed to the upper surface of the third printing layer 107 through an insulating material. The second incision pattern IP2 is located above the second hole H2 to provide an air flow passage. Therefore, it is possible to prevent twisting or lifting of the protective member FP_1 due to a hot air flow in an autoclave process, and it is possible to effectively prevent contamination and damage of the plurality of holes H1, H2, H3, and SH and the like of the cover window 100.

Figure 9:
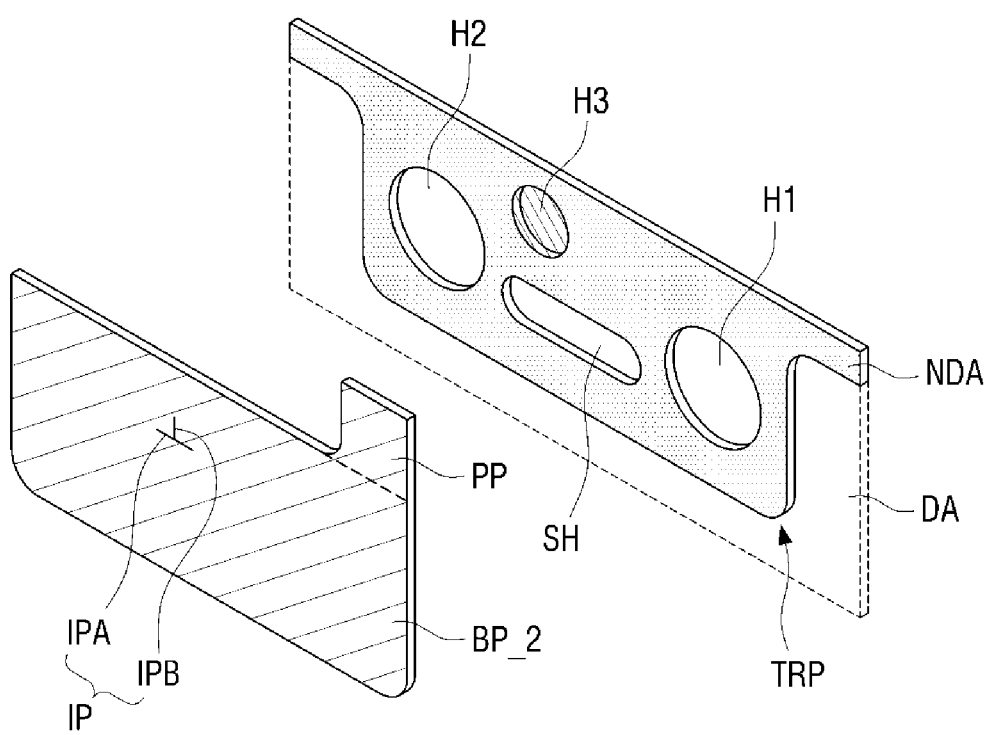
FIG. 9 is an exploded perspective view of a trench portion of a cover window according to some exemplary embodiments.
Figure 9:
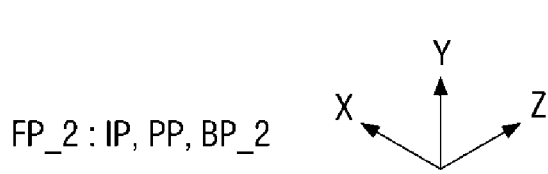
Figure 10:
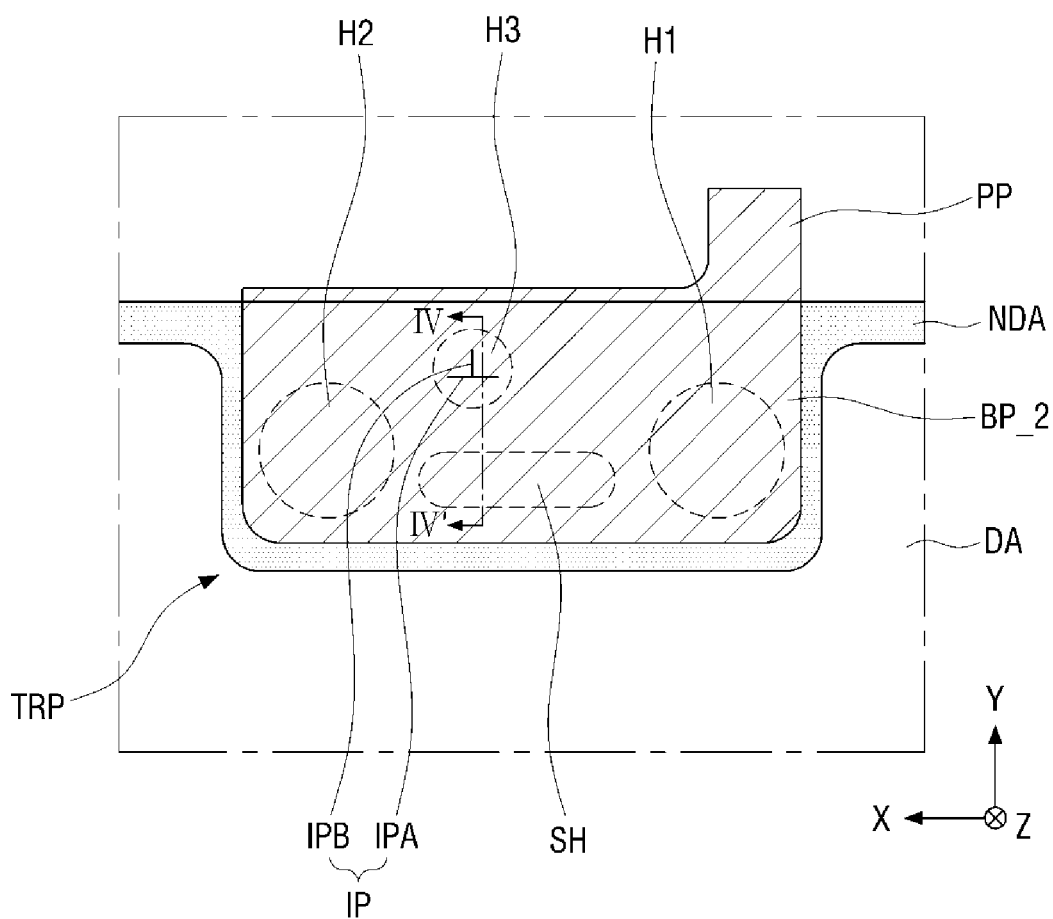
FIG. 10 is an enlarged view of portion A of FIG. 2 according to some exemplary embodiments.

FIG. 9 is an exploded perspective view of a trench portion of a cover window according to some exemplary embodiments. FIG. 10 is an enlarged view of portion A of FIG. 2 according to some exemplary embodiments. FIG. 11 is a cross-sectional view taken along sectional line IV-IV' of FIG. 10 according to some exemplary embodiments. The exemplary embodiments described in association with FIGS. 9 to 11 differ from the exemplary embodiments described in association with FIGS. 3 to 5 in the arrangement of incision patterns. As such, a description overlapping with the description with reference to FIGS. 3 to 5 will be omitted, and differences will be mainly described.

Referring to FIGS. 9 and 10, an incision pattern IP may include a first incision portion IPA extending in the first direction (e.g., X-axis direction), and a second incision portion IPB extending in the second direction (e.g., Y-axis direction) from the first incision portion IPA.

In some exemplary embodiments, the incision pattern IP may be disposed corresponding to the third hole H3. For example, the incision pattern IP may overlap the third hole H3 in the third direction (e.g., Z-axis direction). However, exemplary embodiments are not limited thereto. In some exemplary embodiments, the incision pattern IP may not partially overlap the third hole H3 in the third direction (e.g., Z-axis direction).

The incision pattern IP is formed so as to pass through a protective member FP_2 such that an air flow passage is formed in the protective member FP_2. Accordingly, it is possible to prevent twisting or lifting of the protective member FP_2 due to a hot air flow in an autoclave process, and it is possible to effectively prevent contamination and damage of the plurality of holes H1, H2, H3, and SH and the like of the cover window 100.

Referring to FIG. 11, the third hole H3 disposed in the trench portion TRP of the window member WP may be defined by the first printing layer 103, the second printing layer 105, and the third printing layer 107. For example, since the first printing layer 103, the second printing layer 105, and the third printing layer 107 are not disposed in a region corresponding to the third hole H3 disposed in the trench portion TRP, the third hole H3 may be defined by a step with the surrounding light shielding area NDA.

An infrared printing layer 109 may be disposed on the transparent base layer 101 corresponding to the third hole H3. The infrared printing layer 109 has a low transmittance in the ultraviolet and visible range and a high transmittance in the infrared range. Thus, the infrared sensor disposed corresponding to the third hole H3 in the display device can transmit and receive infrared rays through the infrared printing layer 109.

The length of the speaker hole SH in the third direction (e.g., Z-axis direction) may be longer than the length of the third hole H3 in the third direction (e.g., Z-axis direction). Further, as can be appreciated from FIGS. 8 and 11, the length of the first hole H1 and the second hole H2 in the third direction (e.g., Z-axis direction) may be longer than the length of the third hole H3 in the third direction (e.g., Z-axis direction), and the length of the speaker hole SH in the third direction (e.g., Z-axis direction) may be longer than the length of the first hole H1 and the second hole H2 in the third direction (e.g., Z-axis direction). However, exemplary embodiments are not limited thereto.

A body portion BP_2 of the protective member FP_2 is disposed on the third printing layer 107, and the body portion BP_2 may be adhered and fixed to the upper surface of the third printing layer 107 through an insulating material. The incision pattern IP is located above the third hole H3 to provide an air flow passage. Therefore, it is possible to prevent twisting or lifting of the protective member FP_2 due to a hot air flow in an autoclave process, and it is possible to effectively prevent contamination and damage of the plurality of holes H1, H2, H3, and SH and the like of the cover window 100.

Figure 12:
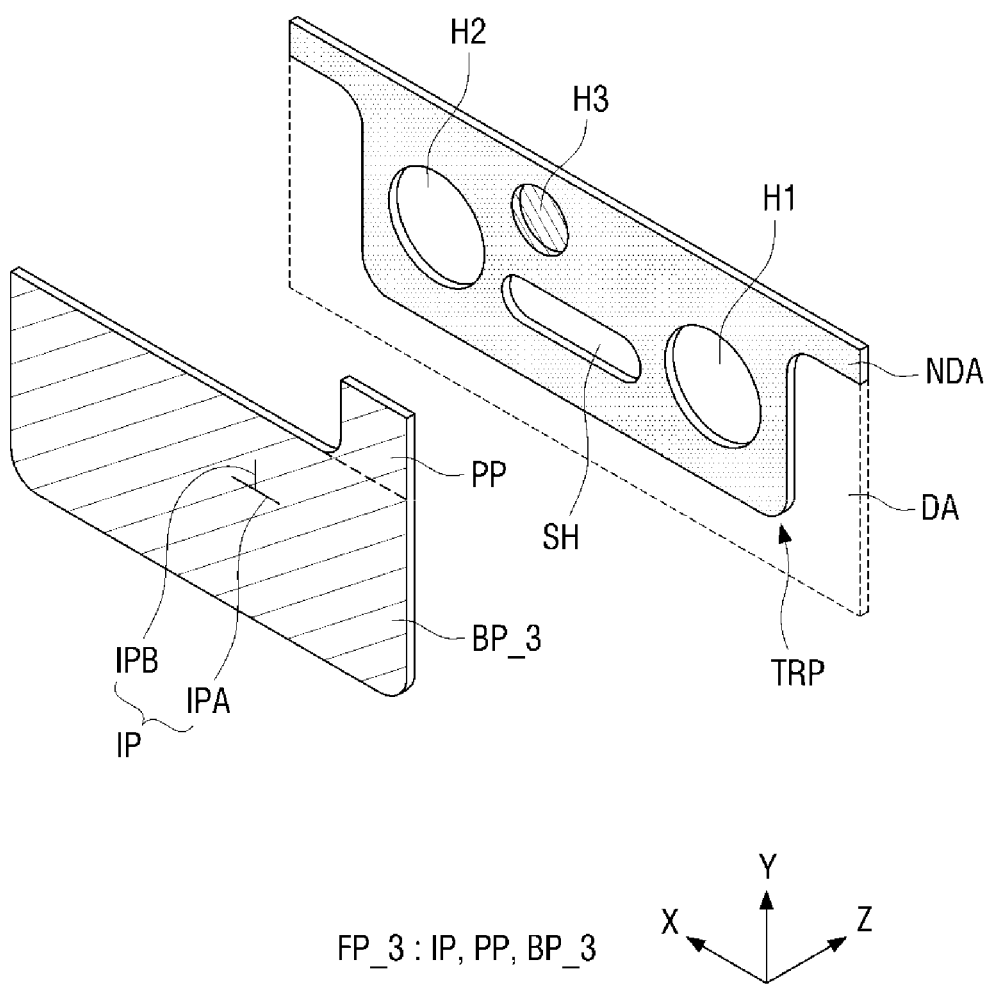
FIG. 12 is an exploded perspective view of a trench portion of a cover window according to some exemplary embodiments.
Figure 13:
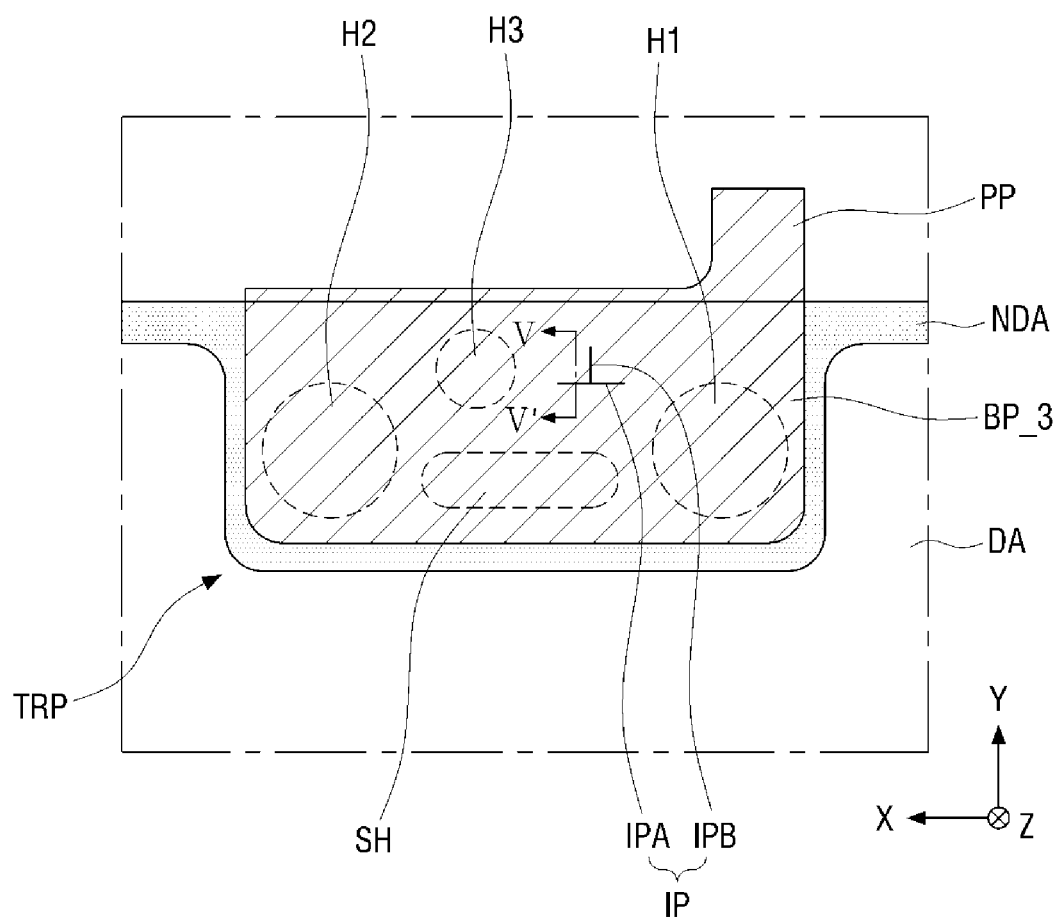
FIG. 13 is an enlarged view of portion A of FIG. 2 according to some exemplary embodiments.
Figure 14:
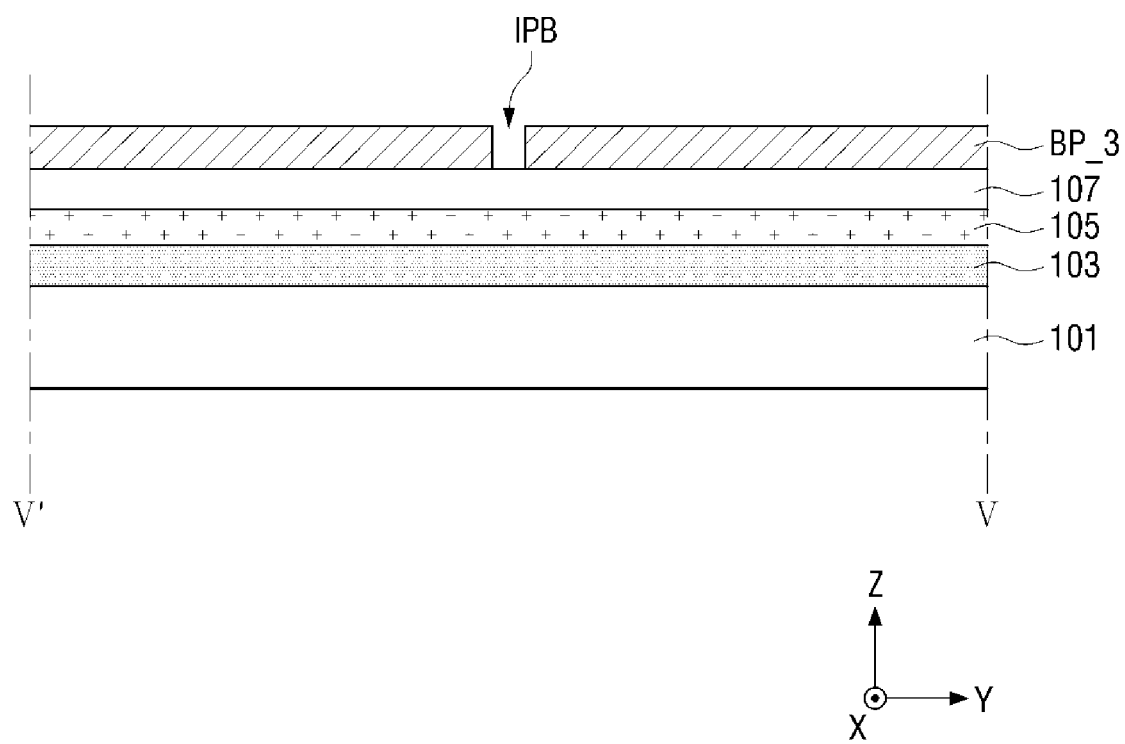
FIG. 14 is a cross-sectional view taken along sectional line V-V of FIG. 13 according to some exemplary embodiments.

FIG. 12 is an exploded perspective view of a trench portion of a cover window according to some exemplary embodiments. FIG. 13 is an enlarged view of portion A of FIG. 2 according to some exemplary embodiments. FIG. 14 is a cross-sectional view taken along sectional line V-V' of FIG. 13 according to some exemplary embodiments. The exemplary embodiments described in association with FIGS. 12 to 14 differ from the exemplary embodiments described in association with FIGS. 3 to 5 in the arrangement of incision patterns. A description overlapping with the description with reference to FIGS. 3 to 5 will be omitted, and differences will be mainly described.

Referring to FIGS. 12-14, an incision pattern IP may include a first incision portion IPA extending in the first direction (e.g., X-axis direction), and a second incision portion IPB extending in the second direction (e.g., Y-axis direction) from the first incision portion IPA.

In some exemplary embodiments, the incision pattern IP is disposed corresponding to the trench portion TRP of the light shielding area NDA, and may be disposed corresponding to a region where the first hole H1, the second hole H2, the third hole H3, and the speaker hole SH are not disposed. For example, the incision pattern IP may be disposed corresponding to a region where all of the transparent base layer 101, the first printing layer 103, the second printing layer 105, and the third printing layer 107 are stacked. However, exemplary embodiments are not limited thereto, and the incision pattern IP may be disposed corresponding to a region where the transparent base layer 101, the first printing layer 103, and the second printing layer 105 are stacked. As described above, even when the incision pattern IP is disposed corresponding to a region where the first hole H1, the second hole H2, the third hole H3, and the speaker hole SH are not disposed, a hot air flow between the third printing layer 107 and a protective member FP_3 can be discharged through the incision pattern IP. Therefore, it is possible to prevent twisting or lifting of the protective member FP_3 due to a hot air flow in an autoclave process, and it is possible to effectively prevent contamination and damage of the plurality of holes H1, H2, H3, and SH and the like of the cover window 100.

Figure 22:
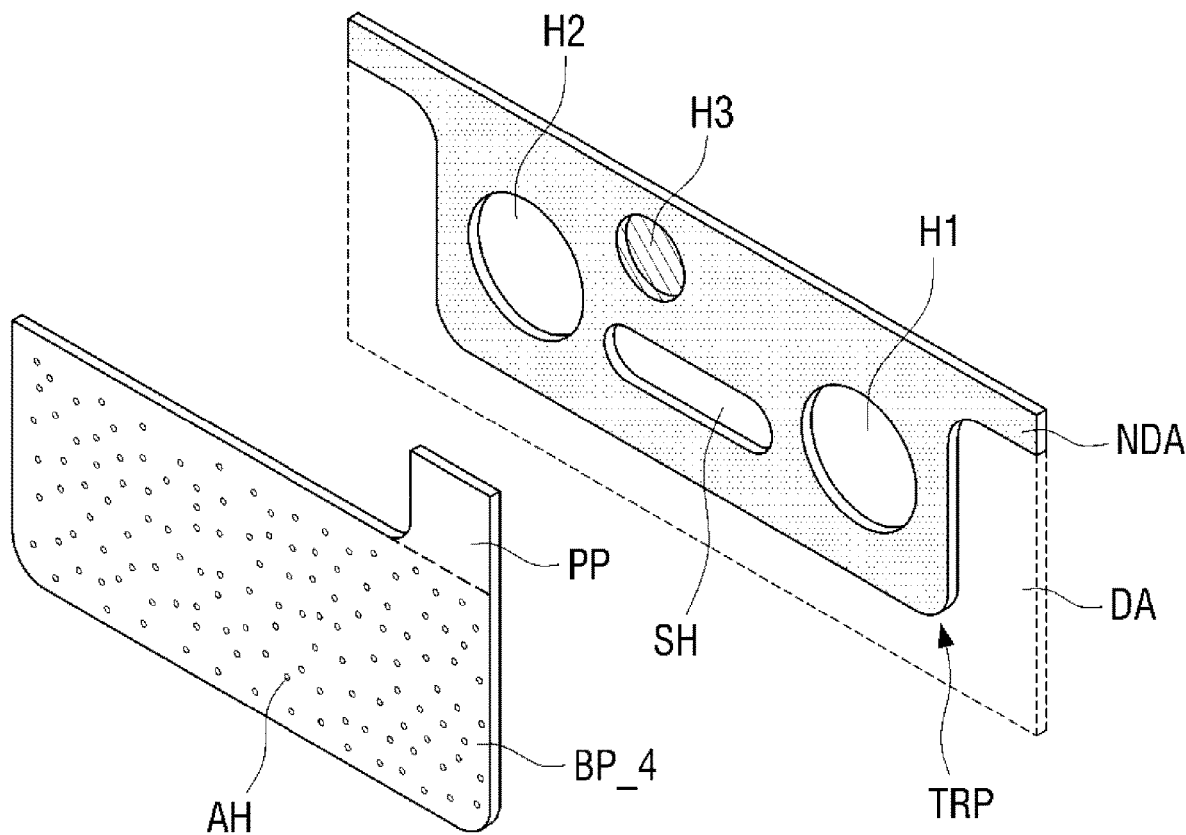
FIG. 22 is an exploded perspective view of a trench portion of a cover window according to some exemplary embodiments.
Figure 23:
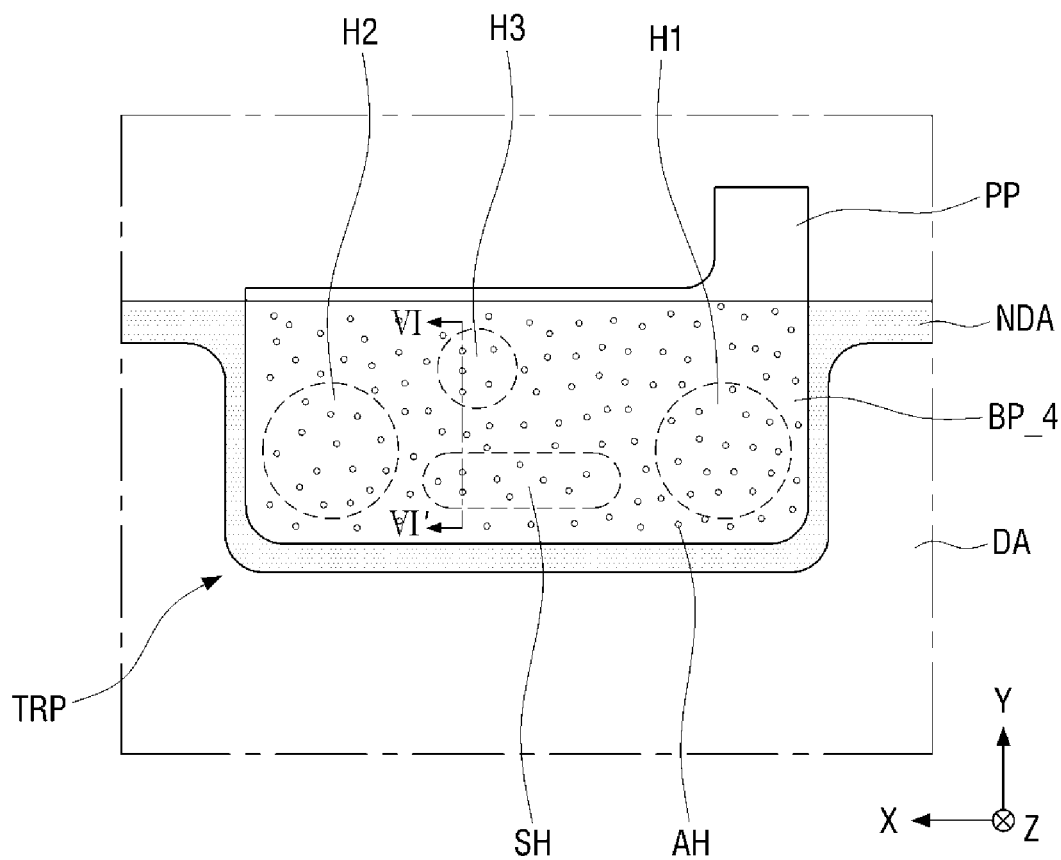
FIG. 23 is an enlarged view of portion A of FIG. 2 according to some exemplary embodiments.
Figure 24:
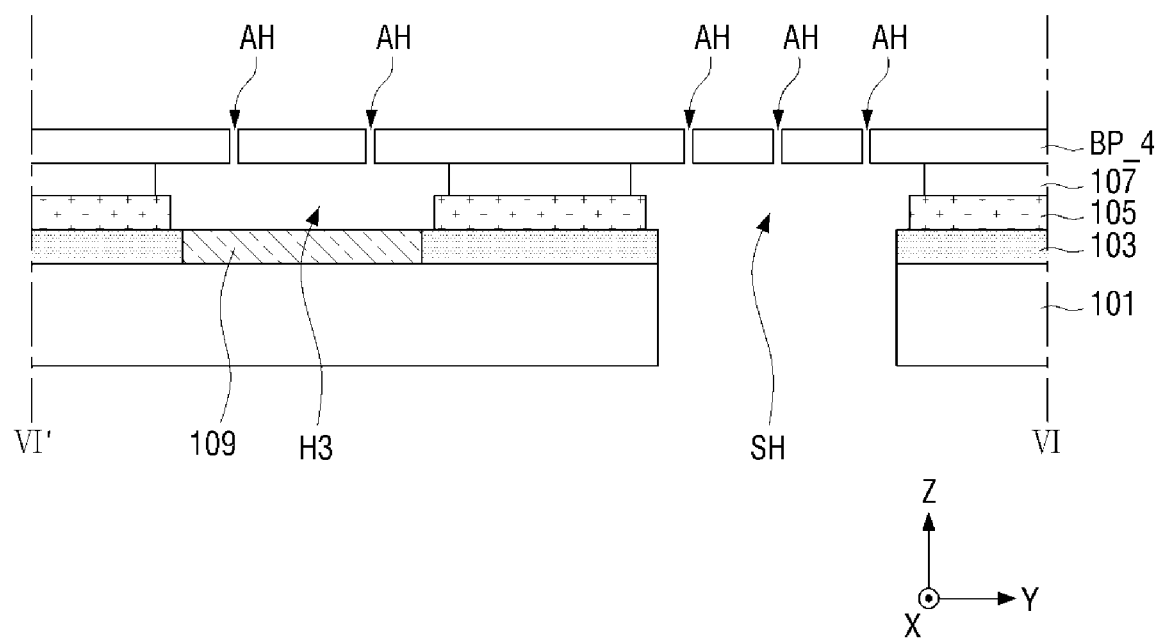
FIG. 24 is a cross-sectional view taken along sectional line VI-VI' of FIG. 23 according to some exemplary embodiments.
Figure 25:
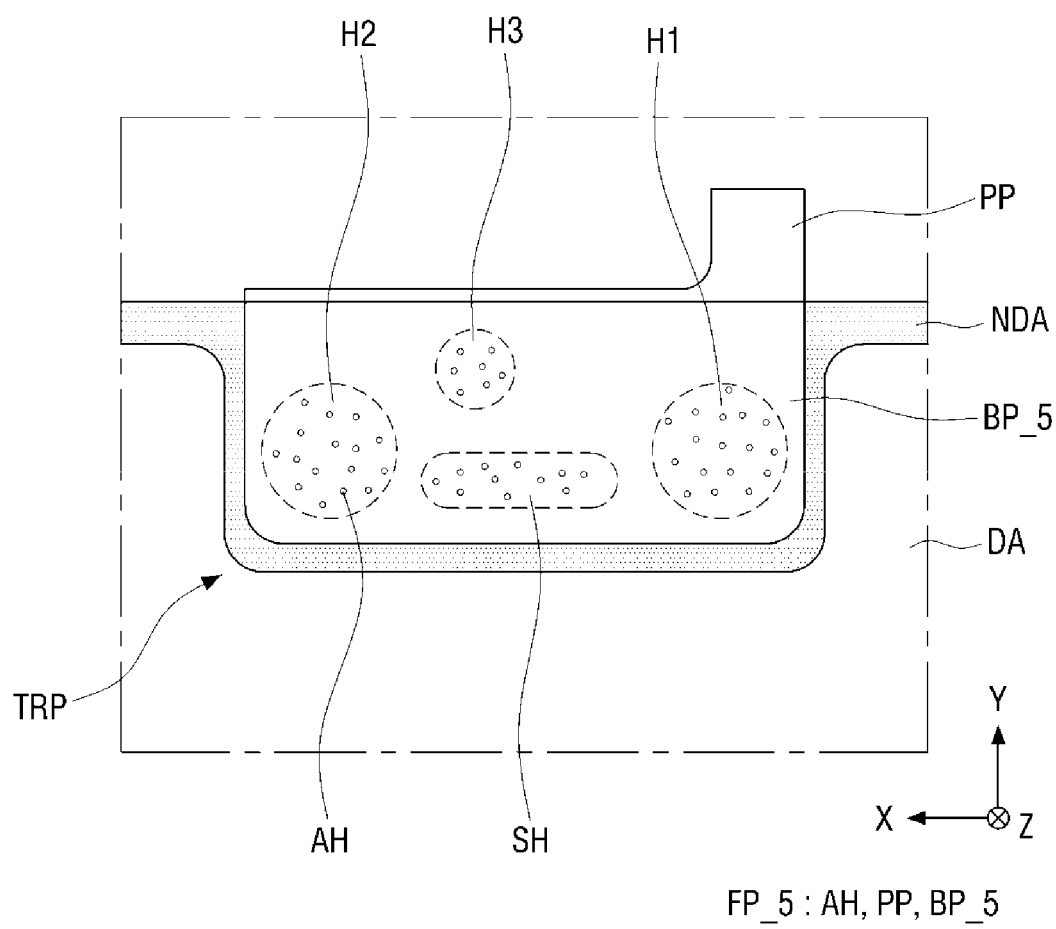
FIG. 25 is an enlarged view of portion A of FIG. 2 according to some exemplary embodiments.
Figure 26:
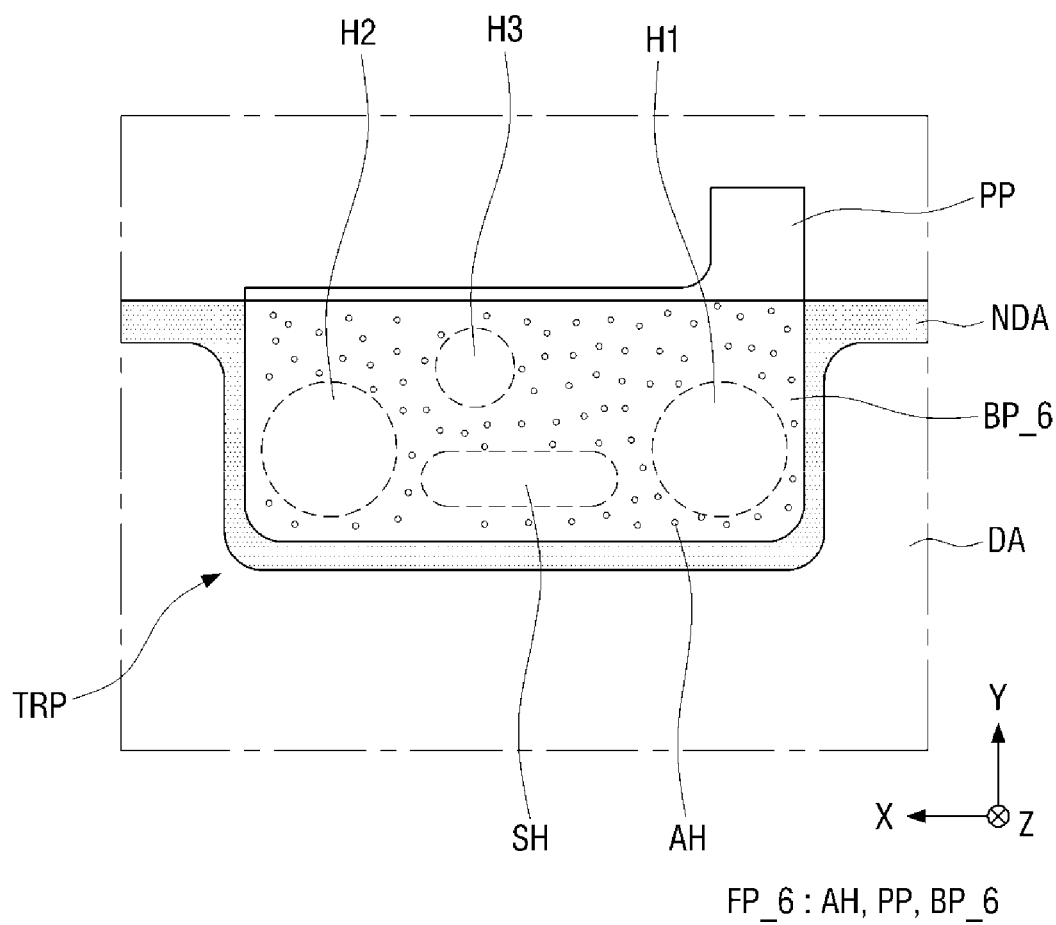
FIG. 26 is an enlarged view of portion A of FIG. 2 according to some exemplary embodiments.

FIG. 22 is an exploded perspective view of a trench portion of a cover window according to some exemplary embodiments. FIG. 23 is an enlarged view of portion A of FIG. 2 according to some exemplary embodiments. FIG. 24 is a cross-sectional view taken along sectional line VI-VI' of FIG. 23 according to some exemplary embodiments. FIG. 25 is an enlarged view of portion A of FIG. 2 according to some exemplary embodiments. FIG. 26 is an enlarged view of portion A of FIG. 2 according to some exemplary embodiments. The exemplary embodiments described in association with FIGS. 22 to 26 differ from the exemplary embodiments described in association with FIGS. 3 to 5 in that air holes AH are formed in a protective member FP_4. A description overlapping with the description with reference to FIGS. 3 to 5 will be omitted, and differences will be mainly described.

Referring to FIGS. 22-24, the protective member FP_4 may include a body portion BP_4, a protrusion portion PP extending in the second direction (e.g., Y-axis direction) from the body portion BP_4, and air holes AH formed in the body portion BP_4.

The air holes AH may be disposed in the body portion BP_4 and the air holes AH may not be disposed in the protrusion portion PP. However, exemplary embodiments are not limited thereto. For instance, the air holes AH may be disposed in the body portion BP_4 and the protrusion portion PP.

The air holes AH may be uniformly distributed over the entire surface of the body portion BP_4; however, exemplary embodiments are not limited thereto. For example, the air holes AH may be disposed corresponding to the third printing layer 107 of the first hole H1, the second hole H2, the third hole H3, the speaker hole SH, and other regions of the trench portion TRP. The air holes AH are fine air holes arranged in the body portion BP_4 of the protective member FP_4 and may serve as an air flow passage. Therefore, it is possible to prevent twisting or lifting of the protective member FP_4 due to a hot air flow in an autoclave process, and it is possible to effectively prevent contamination and damage of the plurality of holes H1, H2, H3, and SH and the like of the cover window 100.

Referring to FIG. 25, in some exemplary embodiments, a protective member FP_5 may include air holes AH arranged in a body portion BP_5 corresponding to each of the first hole H1, the second hole H2, the third hole H3, and the speaker hole SH. Referring to FIG. 26, in some exemplary embodiments, a protective member FP_6 may include air holes AH arranged in a body portion BP_6 excluding regions corresponding to the first hole H1, the second hole H2, the third hole H3, and the speaker hole SH. However, exemplary embodiments are not limited thereto. In some exemplary embodiments, the air holes AH may be disposed only in a region corresponding to the first hole H1, the air holes AH may be disposed only in a region corresponding to the second hole H2, the air holes AH may be disposed only in a region corresponding to the third hole H3, or the air holes AH may be disposed only in a region corresponding to the speaker hole SH.

FIG. 27 is an exploded perspective view of a display module including a cover window according to some exemplary embodiments.

Referring to FIG. 27, a display module 10 according to some exemplary embodiments may include a cover window 100, a touch sensing device 200, and a display panel 300.

The cover window 100 may be any one of the cover windows described with reference to FIGS. 1 to 26, and a protective member FP can be maintained even in a display module assembly process in which the cover window 100 is assembled to the touch sensing device 200 and the display panel 300.

The touch sensing device 200 may be disposed between the cover window 100 and the display panel 300. The touch sensing device 200 may be disposed corresponding to the light transmitting area DA of the cover window 100. However, exemplary embodiments are not limited thereto. For instance, the touch sensing device 200 may be disposed in a part of the light transmitting area DA and the light shielding area NDA of the cover window 100. In this case, a touch (or touch interaction) can be detected even in the light shielding area NDA.

The touch sensing device 200 may be attached to the lower surface of the cover window 100 through a first adhesive layer. A polarizing film (not shown) may be added to the touch sensing device 200 to prevent a decrease in visibility due to reflection of external light. In this case, the polarizing film may be attached to the lower surface of the cover window 100 through the first adhesive layer.

The touch sensing device 200 is a device for sensing a user's touch position and may be implemented as a capacitive type, such as at least one of a self-capacitance type and a mutual capacitance type. The touch sensing device 200 may include only touch driving electrodes when implemented as a self-capacitance type, and the touch sensing device 200 may include touch driving electrodes and touch sensing electrodes when implemented as a mutual capacitance type. Hereinafter, a case where the touch sensing device 200 is implemented as a mutual capacitance type will be mainly described.

The touch sensing device 200 may be formed in a panel form or a film form. In this case, the touch sensing device 200 may be attached onto a thin film encapsulation layer of the display panel 300 through a second adhesive layer (not shown). The second adhesive layer may include optically clear adhesive (OCA) or optically clear resin (OCR).

Alternatively, the touch sensing device 200 may be formed integrally with the display panel 300. In this case, the touch driving electrodes and the touch sensing electrodes of the touch sensing device 200 may be formed on the thin film encapsulation layer of the display panel 300.

The display panel 300 may be disposed under the touch sensing device 200. The display panel 300 may be disposed to overlap the light transmitting area DA of the cover window 100. The display panel 300 may be a light emitting display panel including a light emitting element. For example, the display panel 300 may be an organic light emitting display panel using an organic light emitting diode, a micro light emitting diode display panel using a micro light emitting diode (LED), or a quantum dot light emitting display panel including a quantum dot light emitting diode (QLED).

The display panel 300 may include a substrate, a thin film transistor layer disposed on the substrate, a light emitting element layer, and a thin film encapsulation layer.

Since the display panel 300 may be implemented in a flexible manner, the display panel 300 may be formed of plastic, but exemplary embodiments are not limited thereto. In some exemplary embodiments, the substrate may include a flexible substrate and a support substrate. Since the support substrate may be provided to support the flexible substrate, it may have flexibility lower than that of the flexible substrate. Each of the flexible substrate and the support substrate may include a polymer material having flexibility. For example, each of the flexible substrate and the support substrate may be formed of a material such as at least one of polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), and cellulose acetate propionate (CAP), or a combination thereof.

The thin film transistor layer is disposed on the substrate. The thin film transistor layer may include scan lines, data lines and thin film transistors. Each of the thin film transistors includes a gate electrode, a semiconductor layer, and source and drain electrodes. When a scan driver is formed directly on the substrate, it may be formed together with the thin film transistor layer.

The light emitting element layer is disposed on the thin film transistor layer. The light emitting element layer includes an anode electrode, a light emitting layer, a cathode electrode, and banks. The light emitting layer may include an organic light emitting layer containing an organic material. For example, the light emitting layer may include a hole injection layer, a hole transporting layer, an organic light emitting layer, an electron transporting layer, and an electron injection layer. The hole injection layer and the electron injection layer may be omitted. When a voltage is applied to the anode electrode and the cathode electrode, the holes and electrons move to the organic light emitting layer through the hole transporting layer and the electron transporting layer, respectively, and are combined with each other in the organic light emitting layer to emit light. The light emitting element layer may be a pixel array layer in which pixels are formed. Accordingly, a region in which the light emitting element layer is formed may be defined as a display area for displaying an image. The peripheral area of the display area may be defined as a non-display area.

The thin film encapsulation layer is disposed on the light emitting element layer. The thin film encapsulation layer serves to prevent oxygen and/or moisture from infiltrating into the light emitting element layer. The thin film encapsulation layer may include at least one inorganic film and at least one organic film.

Although not shown, to protect the display module 10, a protective film may be attached to the upper surface of the cover window 100, and a cushion member or the like may be disposed on the lower surface of the display panel 300.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A cover window comprising:
a window member comprising a light transmitting area and a light shielding area; and
a protective member disposed on a surface of the window member and comprising an incision pattern,
wherein:
the light shielding area comprises a trench portion extending concavely toward the light transmitting area; and
the protective member overlaps the trench portion in a thickness direction.

2. The cover window of claim 1, wherein:
the window member comprises a plurality of holes in the trench portion; and
the protective member is disposed corresponding to the plurality of holes.

3. The cover window of claim 2, wherein:
the protective member comprises:
a body portion overlapping the trench portion in the thickness direction; and
a protrusion portion extending from the body portion; and
the protrusion portion does not overlap the window member in the thickness direction.

4. The cover window of claim 3, wherein the incision pattern is disposed in the body portion and configured to discharge a hot air flow between the body portion and the window member.

5. The cover window of claim 4, wherein:
the trench portion comprises:
a transparent base layer; and
a printing layer disposed on the transparent base layer;
the plurality of holes are defined by at least one of the transparent base layer and the printing layer; and
the trench portion comprises:
a first region in which the plurality of holes are arranged; and
a second region in which the transparent base layer and the printing layer are stacked.

6. The cover window of claim 5, wherein the incision pattern is disposed corresponding to at least one of the plurality of holes.

7. The cover window of claim 5, wherein the incision pattern overlaps the second region in the thickness direction.

8. The cover window of claim 5, wherein:
the plurality of holes comprise a speaker hole, which is a physical hole in at least a portion of the transparent base layer; and
the incision pattern is disposed corresponding to the speaker hole.

9. The cover window of claim 5, wherein an area of the body portion is smaller than an area of the trench portion.

10. The cover window of claim 5, wherein the protective member comprises a film coated with an adhesive material.

11. The cover window of claim 10, wherein the adhesive material is only disposed on a surface of the body portion that is in contact with the trench portion.

12. The cover window of claim 11, wherein the film comprises a polyethylene terephthalate (PET)-based resin.

13. The cover window of claim 1, wherein the incision pattern comprises:
a first incision portion extending in a first direction; and
a second incision portion extending in a second direction perpendicular to the first direction, the second incision portion extending from the first incision portion.

14. A cover window comprising:
a window member comprising a light transmitting area and a light shielding area; and
a protective member disposed on a surface of the window member and comprising a plurality of air holes,
wherein:
the light shielding area comprises a trench portion extending concavely toward the light transmitting area; and
the protective member overlaps the trench portion in a thickness direction.

15. The cover window of claim 14, wherein:
the window member comprises a plurality of holes in the trench portion; and
the protective member is disposed corresponding to the plurality of holes.

16. The cover window of claim 15, wherein:
the protective member comprises:
a body portion overlapping the trench portion in the thickness direction; and
a protrusion portion extending from the body portion; and
the protrusion portion does not overlap the window member in the thickness direction.

17. The cover window of claim 16, wherein the plurality of air holes are disposed in the body portion and configured to discharge a hot air flow between the body portion and the window member.

18. A display module comprising:
a cover window; and
a display panel disposed on the cover window,
wherein the cover window comprises:
    a window member comprising a light transmitting area and a light shielding area; and
    a protective member disposed on a surface of the window member, the protective member comprising an incision pattern,
wherein the light shielding area comprises a trench portion extending concavely toward the light transmitting area, and
wherein the protective member overlaps the trench portion in a thickness direction.

19. The display module of claim 18, wherein:
the display panel does not overlap the trench portion in the thickness direction; and
the protective member overlaps the trench portion in the thickness direction.

20. The display module of claim 19, wherein:
the protective member comprises:
    a body portion overlapping the trench portion in the thickness direction; and
    a protrusion portion extending from the body portion;
the protrusion portion does not overlap the window member in the thickness direction; and
the incision pattern is disposed in the body portion and configured to discharge a hot air flow between the body portion and the window member.

* * * * *